United States Patent
Uchida

(10) Patent No.: US 9,549,263 B2
(45) Date of Patent: Jan. 17, 2017

(54) ACOUSTIC TRANSDUCER AND MICROPHONE

(71) Applicant: OMRON Corporation, Kyoto-shi, Kyoto (JP)

(72) Inventor: Yuki Uchida, Shiga (JP)

(73) Assignee: OMRON Corporation, Kyoto (JP)

( * ) Notice: Subject to any disclaimer, the term of this patent is extended or adjusted under 35 U.S.C. 154(b) by 3 days.

(21) Appl. No.: 14/482,693

(22) Filed: Sep. 10, 2014

(65) Prior Publication Data
US 2015/0078593 A1 Mar. 19, 2015

(30) Foreign Application Priority Data
Sep. 13, 2013 (JP) ................. 2013-190303

(51) Int. Cl.
*H04R 25/00* (2006.01)
*H04R 19/00* (2006.01)

(52) U.S. Cl.
CPC .................. *H04R 19/005* (2013.01)

(58) Field of Classification Search
CPC ............... H04R 9/047; H04R 19/01
USPC ........................................ 381/191
See application file for complete search history.

(56) References Cited

U.S. PATENT DOCUMENTS

| | | | | |
|---|---|---|---|---|
| 5,440,192 A * | 8/1995 | Kasuga | ................. | H02N 2/166 310/323.05 |
| 7,346,178 B2 * | 3/2008 | Zhe | .................... | H04R 31/003 381/174 |
| 7,907,744 B2 * | 3/2011 | Kasai | .................... | G01H 11/06 381/174 |
| 8,737,171 B2 * | 5/2014 | Jenkins | ................ | B81B 3/0021 257/419 |
| 2008/0123878 A1 * | 5/2008 | Zhe | ...................... | H04R 31/003 381/191 |
| 2008/0192962 A1 * | 8/2008 | Halteren | ............... | H04R 1/222 381/170 |
| 2011/0255721 A1 * | 10/2011 | Chen | .................... | H04R 19/01 381/191 |
| 2012/0091545 A1 * | 4/2012 | Reichenbach | ....... | B81B 3/0008 257/416 |
| 2012/0210400 A1 * | 8/2012 | Wu | ...................... | H04L 63/107 726/4 |
| 2012/0213400 A1 * | 8/2012 | Kasai | .................... | H04R 19/04 381/369 |

FOREIGN PATENT DOCUMENTS

JP 2012-147115 A 8/2012

\* cited by examiner

*Primary Examiner* — Curtis Kuntz
*Assistant Examiner* — Julie X Dang
(74) *Attorney, Agent, or Firm* — Osha Liang LLP

(57) ABSTRACT

An acoustic transducer has a substrate having a cavity, a vibrating electrode plate disposed above the substrate and having a void portion that allows pressure to escape, a fixed electrode plate disposed above the substrate opposite the vibrating electrode plate, a plurality of sensing portions configured by the vibrating electrode plate and the fixed electrode plate, at least one of the vibrating electrode plate and the fixed electrode plate being divided into a plurality of regions, and a sensing portion being configured by the vibrating electrode plate and the fixed electrode plate in each of the divided regions, and a leak pressure regulation portion that hinders leakage of air pressure passing through the void portion when the vibrating electrode plate is not undergoing deformation.

26 Claims, 29 Drawing Sheets

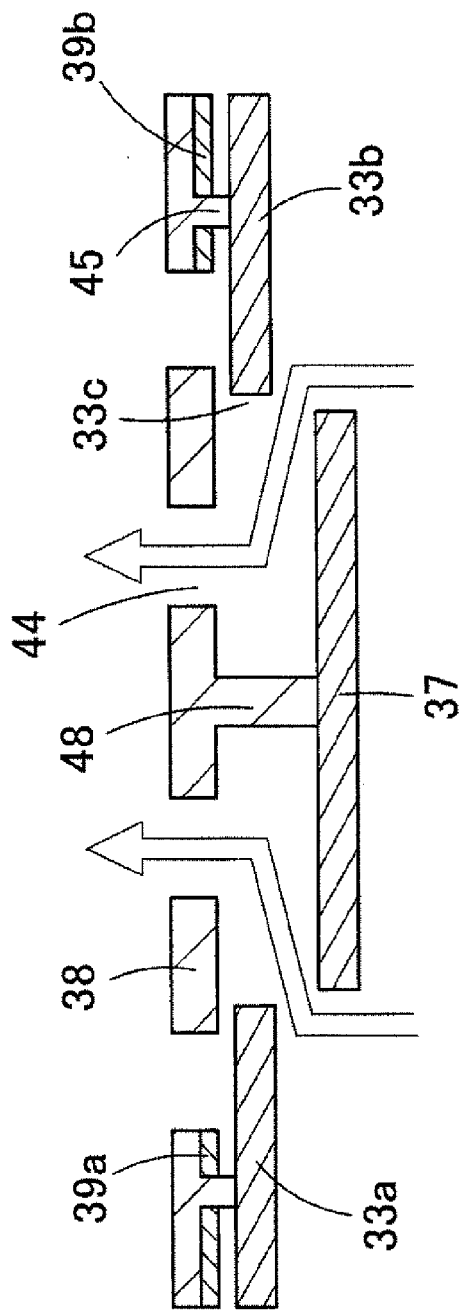
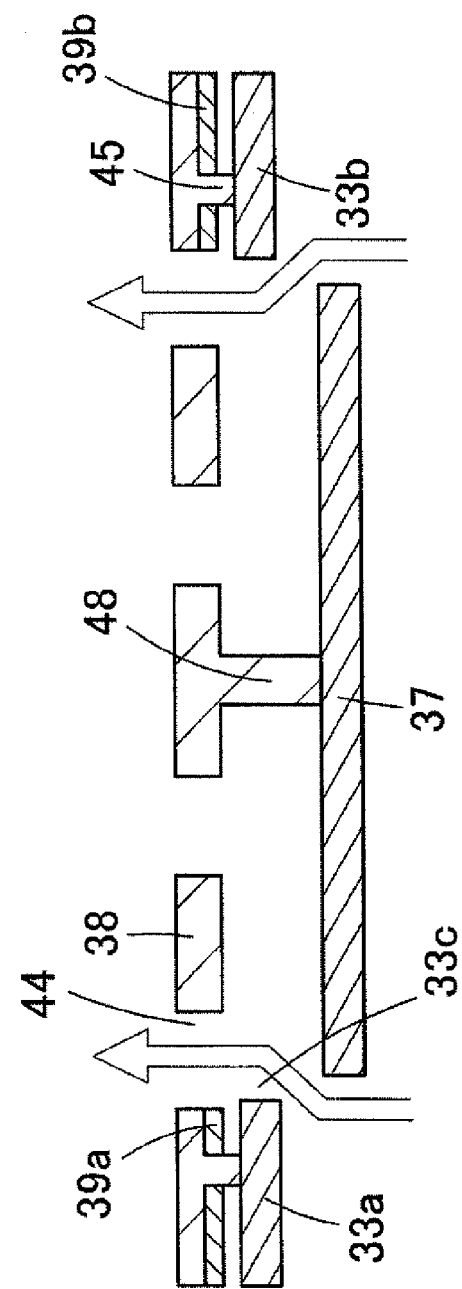
FIG. 11A
FIG. 11B

ACOUSTIC TRANSDUCER AND MICROPHONE

BACKGROUND

Field

The present invention relates to an acoustic transducer and a microphone. Specifically, the present invention relates to a capacitance type of acoustic transducer configured by a capacitor structure made up of a vibrating electrode plate (diaphragm) and a fixed electrode plate. The present invention also relates to a microphone that employs this acoustic transducer. In particular, the present invention relates to a very small-sized acoustic transducer created using MEMS (Micro Electro Mechanical System) technology.

Related Art

In recent years, there has been demand for microphones to detect sounds with high sensitivity in a range from low sound pressure to high sound pressure. In general, the maximum input sound pressure of a microphone is limited by the harmonic distortion rate (total harmonic distortion). This is because when a microphone attempts to detect a sound having a high sound pressure, harmonic distortion occurs in the output signal, and the sound quality and precision become impaired. Accordingly, if the harmonic distortion rate can be reduced, it is possible to raise the maximum input sound pressure and widen the detectable sound pressure range (referred to hereinafter as the "dynamic range") of the microphone.

However, in general microphones, there is a trade-off relationship between an improvement in the acoustic vibration detection sensitivity and a reduction in the harmonic distortion rate, and it has been difficult to provide a microphone with a wide dynamic range from low-volume (low sound pressure) sounds to high-volume (high sound pressure) sounds.

In this technical background, a method of using of an acoustic sensor structured as shown in FIGS. 1A and 1B has been proposed as a method for realizing a microphone that has a wide dynamic range. FIG. 1A is a cross-sectional diagram of an acoustic sensor 11 according to a conventional example, and FIG. 1B is a plan view of a state where a back plate 19 has been removed.

In the acoustic sensor 11, a first diaphragm 16a and a second diaphragm 16b that are divided by a slit 17 are arranged above a substrate 12 that has a cavity 13. The first diaphragm 16a has a relatively larger area and is supported on the upper surface of the substrate 12 by anchors 18a. The second diaphragm 16b has a relatively smaller area and is supported on the upper surface of the substrate 12 by anchors 18b. A back plate 19 is provided on the upper surface of the substrate 12 so as to cover the two diaphragms 16a and 16b, and a first fixed electrode plate 20a and a second fixed electrode plate 20b are arranged on the lower surface of the back plate 19 so as to oppose the first diaphragm 16a and the second diaphragm 16b. A large number of acoustic holes 21 are formed in the back plate 19 and the fixed electrode plates 20a and 20b.

In the acoustic sensor 11, a high-sensitivity first acoustic sensing portion 14 that can detect low-volume (low sound pressure) sounds is configured by the first diaphragm 16a and the first fixed electrode plate 20a that oppose each other. Also, a low-sensitivity second acoustic sensing portion 15 that can detect high-volume (high sound pressure) sounds is configured by the second diaphragm 16b and the second fixed electrode plate 20b that oppose each other. Also, the output from the acoustic sensor 11 is switched between output from the first acoustic sensing portion 14 and output from the second acoustic sensing portion 15 according to the volume, thus making it possible to detect sounds with high sensitivity in a range from low sound pressure to high sound pressure. One example of such an acoustic sensor is disclosed in JP 2012-147115A.

JP 2012-147115A is an example of background art.

SUMMARY

However, when a large degree of pressure is applied to the diaphragms 16a and 16b in this capacitance type of acoustic sensor 11, there are cases where the diaphragms 16a and 16b and the back plate 19 become damaged. Examples of situations in which a large degree of pressure is applied to the diaphragms 16a and 16b include the case where the diaphragms 16a and 16b are subjected to the pressure of air entering through the cavity 13 in a drop test performed on the acoustic sensor 11, the case where the device, such as a mobile phone, that includes the acoustic sensor 11 is dropped, the case where air is forcefully blown into the mouthpiece of a mobile phone that includes the acoustic sensor 11, and the case where the mouthpiece is tapped by a finger or the like. In these cases, a pressure of several hundred Pa or more is applied to the diaphragms 16a and 16b (the maximum measurable sound pressure of the acoustic sensor is up to 200 Pa).

For example, FIG. 2 shows the acoustic sensor 11 mounted on a casing 22. In this structure, a sound introduction hole 23 is formed in the casing 22 in opposition to the cavity 13 of the acoustic sensor 11, and acoustic vibration enters the acoustic sensor 11 through the sound introduction hole 23 and is detected by the first diaphragm 16a and the second diaphragm 16b. If the casing 22 with the acoustic sensor 11 included therein is dropped on a floor 24, the air pressure inside the cavity 13 rises due to the air current entering through the sound introduction hole 23, and the diaphragms 16a and 16b undergo large deformation due to the pressure load.

If a large degree of pressure P is applied to the diaphragms 16a and 16b in this way, as shown in FIGS. 3A to 3C, the diaphragms 16a and 16b bend a large amount due to the pressure P, the diaphragms 16a and 16b collide with the back plate 19, and the back plate 19 also undergoes deformation. Here, FIGS. 3A, 3B, and 3C are respectively a schematic cross-sectional diagram taken along a line X1-X1 in FIG. 1B, a schematic cross-sectional diagram taken along a line X2-X2 in FIG. 1B, and a schematic cross-sectional diagram taken along a line X3-X3 in FIG. 1B. There are cases where the diaphragms 16a and 16b and the back plate 19 become damaged or cracked as a result of undergoing large deformation or due to shock during an impact, and the damage resistance of the acoustic sensor 11 may be poor. In particular, as shown in FIG. 3C, the second diaphragm 16b for high-volume sounds has increased rigidity and a reduced area in order to operate optimally in the case of high sound pressure, and therefore is likely to become damaged due to undergoing steep deformation and the occurrence of large distortion.

One or more embodiments of the present invention provides a capacitance type of acoustic transducer that can maintain the frequency characteristics in acoustic vibration detection while also being able to avoid the concentration of stress and damage to a vibrating electrode plate (diaphragm) and a back plate by suppressing deformation of the vibrating electrode plate when a large degree of air pressure is applied.

An acoustic transducer according to one or more embodiments of the present invention includes: a substrate having a cavity; a vibrating electrode plate arranged above the substrate and having a void portion configured to allow pressure to escape; a fixed electrode plate arranged above the substrate so as to oppose the vibrating electrode plate; a plurality of sensing portions configured by the vibrating electrode plate and the fixed electrode plate, at least one of the vibrating electrode plate and the fixed electrode plate being divided into a plurality of regions, and a sensing portion being configured by the vibrating electrode plate and the fixed electrode plate in each of the divided regions; and a leak pressure regulation portion arranged so as to hinder leakage of air pressure passing through the void portion when the vibrating electrode plate is not undergoing deformation, and to become separated from the void portion and allow pressure to escape by passing through the void portion when the vibrating electrode plate undergoes deformation due to being subjected to pressure. Here, the void portion need only be able to allow pressure to escape, and can be an opening, a recession (notch), a hole, a slit-shaped gap, or the like.

In the acoustic transducer of one or more embodiments of the present invention, a void portion for the escape of pressure is provided in the vibrating electrode plate, and the leakage of air pressure passing through the void portion is hindered by the leak pressure regulation portion when the vibrating electrode plate is not undergoing deformation due to excessive pressure, thus making it unlikely for air pressure to escape through the void portion in the normal operating state. Accordingly, the measurement sensitivity of the acoustic transducer in the low frequency range is not likely to decrease, regardless of the fact that the void portion is provided in the vibrating electrode plate. On the other hand, when the vibrating electrode plate is subjected to excessive pressure and the vibrating electrode plate undergoes large deformation, the void portion is opened and the excessive pressure (high-load pressure) escapes through the void portion, thus suppressing deformation of the vibrating electrode plate due to the excessive pressure. For this reason, the vibrating electrode plate is not likely to become damaged even if the acoustic transducer is dropped or excessive pressure is applied.

In an acoustic transducer according to one or more embodiments of the present invention, the plurality of sensing portions output signals with different sensitivities. Accordingly, the dynamic range of the acoustic transducer can be widened by compositing or switching the signals from the sensing portions.

In an acoustic transducer according to one or more embodiments of the present invention, the void portion is a gap between divided regions of the vibrating electrode plate. Accordingly, the vibrating electrode plate can be divided into a plurality of regions by the gap. It is therefore possible for the void portion for the escape of air pressure to also serve as the opening for dividing the vibrating electrode plate into multiple regions, and the structure of the vibrating electrode plate can be simplified. Also, the total opening area in the vibrating electrode plate (the sum of the area of the void portion for the escape of air pressure and the area of the opening for dividing the vibrating electrode plate) is reduced, thus contributing to a reduction in the size of the acoustic transducer and also improving the strength of the vibrating electrode plate.

Also, in one or more embodiments of the present invention, the leak pressure regulation portion is a plate-shaped member that is accommodated in the gap in the vibrating electrode plate when the vibrating electrode plate is not undergoing deformation. Accordingly, the leakage of pressure through the gap is hindered by the leak pressure regulation portion in the normal operating state, but when the vibrating electrode plate undergoes large deformation due to excessive pressure, the gap in the vibrating electrode plate moves away from the leak pressure regulation portion so as to open and allow the escape of pressure.

In an acoustic transducer according to one or more embodiments of the present invention, the void portion is an opening formed in the vibrating electrode plate. In one or more embodiments of the present invention, the leak pressure regulation portion may be a plate-shaped member that is accommodated in the opening in the vibrating electrode plate when the vibrating electrode plate is not undergoing deformation. Accordingly, the leakage of pressure through the opening can be hindered by the leak pressure regulation portion in the normal operating state, but when the vibrating electrode plate undergoes large deformation due to excessive pressure, the opening in the vibrating electrode plate moves away from the leak pressure regulation portion so as to open and allow the escape of pressure through the opening.

In an acoustic transducer according to one or more embodiments of the present invention, the void portion is a recession that is formed in an edge of the vibrating electrode plate and is recessed toward the interior of the vibrating electrode plate. In one or more embodiments of, the leak pressure regulation portion may be a plate-shaped member that is located in the recession in the vibrating electrode plate when the vibrating electrode plate is not undergoing deformation. Accordingly, the leakage of air pressure through the recession can be hindered by the leak pressure regulation portion in the normal operating state, but when the vibrating electrode plate undergoes large deformation due to excessive pressure, the recession in the vibrating electrode plate moves away from the leak pressure regulation portion so as to open and allow the escape of pressure through the recession.

In an acoustic transducer according to one or more embodiments of the present invention, the leak pressure regulation portion is located in the void portion in the vibrating electrode plate when the vibrating electrode plate is not undergoing deformation, and a slit is formed between an edge of the leak pressure regulation portion and an edge of the void portion. This is because if the slit is not formed between the leak pressure regulation portion and the void portion, the leak pressure regulation portion and the vibrating electrode plate will partially be in contact, and therefore the vibration of the vibrating electrode plate will be hindered by the leak pressure regulation portion, and the sensitivity of the acoustic transducer and the like will be influenced. Also, if the width of the slit is less than or equal to 10 μm, a reduction in the sensitivity of the acoustic transducer in the low frequency range can be sufficiently suppressed.

Also, in one or more embodiments of the present invention, in which the gap between the regions obtained by division of the vibrating electrode plate serves as the leak pressure regulation portion, it is desirable that an end of a slit formed between the leak pressure regulation portion and a divided region of the vibrating electrode plate located on one side across the gap and an end of a slit formed between the leak pressure regulation portion and a divided region of the vibrating electrode plate located on another side across the gap intersect with an angle of 90°. Accordingly, stress is not likely to concentrate in the leak pressure regulation portion, and it is possible to avoid the formation of a portion having a large opening area in part of the gap.

In another mode of the leak pressure regulation portion, the leak pressure regulation portion may be a portion of an upper surface of the substrate that is located so as to block the lower opening of the void portion in the vibrating electrode plate when the vibrating electrode plate is not undergoing deformation. Also, the leak pressure regulation portion may be arranged in opposition to an upper side or a lower side of the vibrating electrode plate so as to block one of an upper opening and a lower opening of the void portion in the vibrating electrode plate when the vibrating electrode plate is not undergoing deformation (note that blockage by the leak pressure regulation portion in this description does not mean hermitic sealing).

In an acoustic transducer according to one or more embodiments of the present invention, a back plate may be arranged above the substrate so as to oppose the vibrating electrode plate, a support portion may be provided on a surface of the back plate that opposes the vibrating electrode plate, and the leak pressure regulation portion may be fixed to the support portion. Accordingly, the leak pressure regulation portion does not undergo deformation even when subjected to excessive pressure, thus making it possible to reliably open the void portion in the vibrating electrode plate when excessive pressure is applied.

In this case, it is desirable that the horizontal cross-sectional area of the support portion is smaller than the area of the leak pressure regulation portion. Accordingly, a space for the escape of pressure can be ensured between the vibrating electrode plate and the outer peripheral surface of the support portion.

Also, the leak pressure regulation portion may be supported by a plurality of support portions. If the leak pressure regulation portion is supported by multiple support portions, the rigidity of the leak pressure regulation portion increases, and the leak pressure regulation portion is not likely to undergo deformation even when subjected to excessive pressure.

Also, in the case where a plurality of support portions are provided, a through-hole may be provided in the back plate between adjacent support portions. Accordingly, excessive pressure can be more efficiently allowed to escape to the outside.

Also, the leak pressure regulation portion may be fixed to a support portion provided on an upper surface of the substrate.

In an acoustic transducer according to one or more embodiments of the present invention, a back plate is arranged above the substrate so as to oppose the vibrating electrode plate, the fixed electrode plate is provided on the back plate so as to oppose the vibrating electrode plate, a plurality of acoustic holes are formed in the back plate and the fixed electrode plate, and a portion of the acoustic holes are overlapped with the void portion in a view from a direction perpendicular to the upper surface of the substrate. Accordingly, excessive pressure can be allowed to smoothly escape to the outside.

In an acoustic transducer according to one or more embodiments of the present invention, a back plate is arranged above the substrate so as to oppose the vibrating electrode plate, the fixed electrode plate is provided on the back plate so as to oppose the vibrating electrode plate, a plurality of acoustic holes are formed in the back plate and the fixed electrode plate, and a portion of the acoustic holes are overlapped with the slit in a view from a direction perpendicular to the upper surface of the substrate. Accordingly, the path for the escape of excessive pressure is short, and therefore excessive pressure can be allowed to smoothly escape to the outside.

In an acoustic transducer according to one or more embodiments of the present invention, a back plate is arranged above the substrate so as to oppose the vibrating electrode plate, the fixed electrode plate is provided on the back plate so as to oppose the vibrating electrode plate, a plurality of acoustic holes are formed in the back plate and the fixed electrode plate, and the width of the leak pressure regulation portion is greater than the distance between adjacent acoustic holes in a view from a direction perpendicular to the upper surface of the substrate. Accordingly, the acoustic holes located above the leak pressure regulation portion are not likely to be blocked by the vibrating electrode plate, and excessive pressure can be reliably discharged.

In an acoustic transducer according to one or more embodiments of the present invention, a back plate is arranged above the substrate so as to oppose the vibrating electrode plate, and the fixed electrode plate is provided on the back plate so as to oppose the vibrating electrode plate and not oppose the leak pressure regulation portion. Accordingly, the parasitic capacitance generated between the leak pressure regulation portion and the fixed electrode plate can be reduced.

In an acoustic transducer according to one or more embodiments of the present invention, the fixed electrode plate is divided into a plurality of regions, and a barrier electrode for blocking electrical signal leakage is provided between divided regions of the fixed electrode plate. Accordingly, it is possible to prevent the leakage of signals and the transmission of noise between adjacent sensing portions.

In an acoustic transducer according to one or more embodiments of the present invention, a back plate is arranged above the substrate so as to oppose the vibrating electrode plate, and a protrusion is provided on the back plate so as to oppose a region of the vibrating electrode plate that is adjacent to the void portion. Accordingly, when the vibrating electrode plate undergoes large deformation, it is not likely to adhere to the fixed electrode plate due to being hindered by the protrusions.

In an acoustic transducer according to one or more embodiments of the present invention, the divided regions of the vibrating electrode plate and the leak pressure regulation portion are in the same plane and are formed using the same material. Accordingly, the vibrating electrode plate and the leak pressure regulation portion can be created at the same time using the same process.

The acoustic transducer according to one or more embodiments of the present invention is applicable to a microphone.

A scope of the present invention includes combinations of the above-described constituent elements, and many variations to disclosed embodiments are possible according to the combination of the constituent elements.

BRIEF DESCRIPTION OF THE DRAWINGS

FIG. 11A is a schematic diagram showing a state in which pressure is escaping in an acoustic sensor in which the slit and acoustic holes are not overlapped with each other. FIG. 11B is a schematic diagram showing a state in which pressure is escaping in an acoustic sensor in which the slit and acoustic holes are overlapped with each other.

FIG. 31 is a schematic cross-sectional diagram of a microphone with an acoustic sensor according to one or more embodiments of the present invention built in.

DETAILED DESCRIPTION

The following describes embodiments of the present invention with reference to the accompanying drawings. Note that the present invention is not limited to the following embodiments, and various design modifications can be made within the scope of the present invention. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Embodiment 1

Figure 1A:
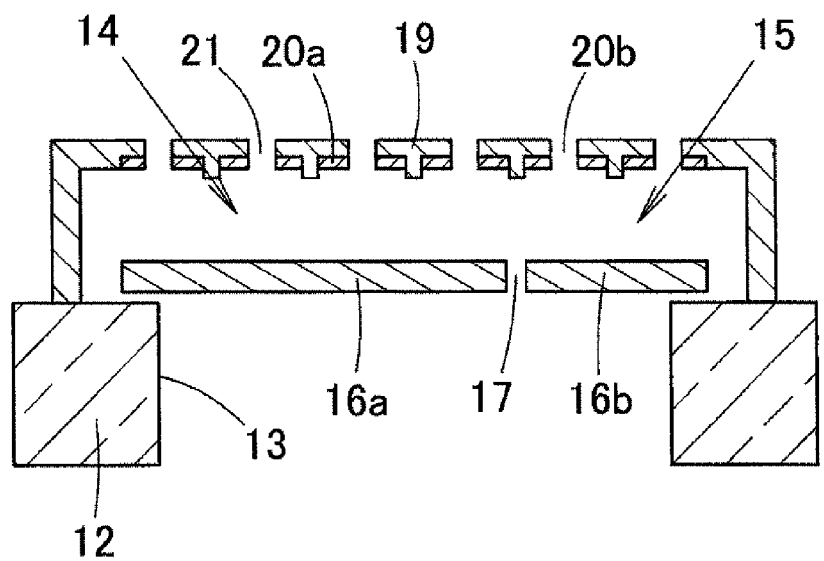
FIG. 1A is a schematic cross-sectional diagram of an acoustic sensor according to a conventional example.
Figure 1B:
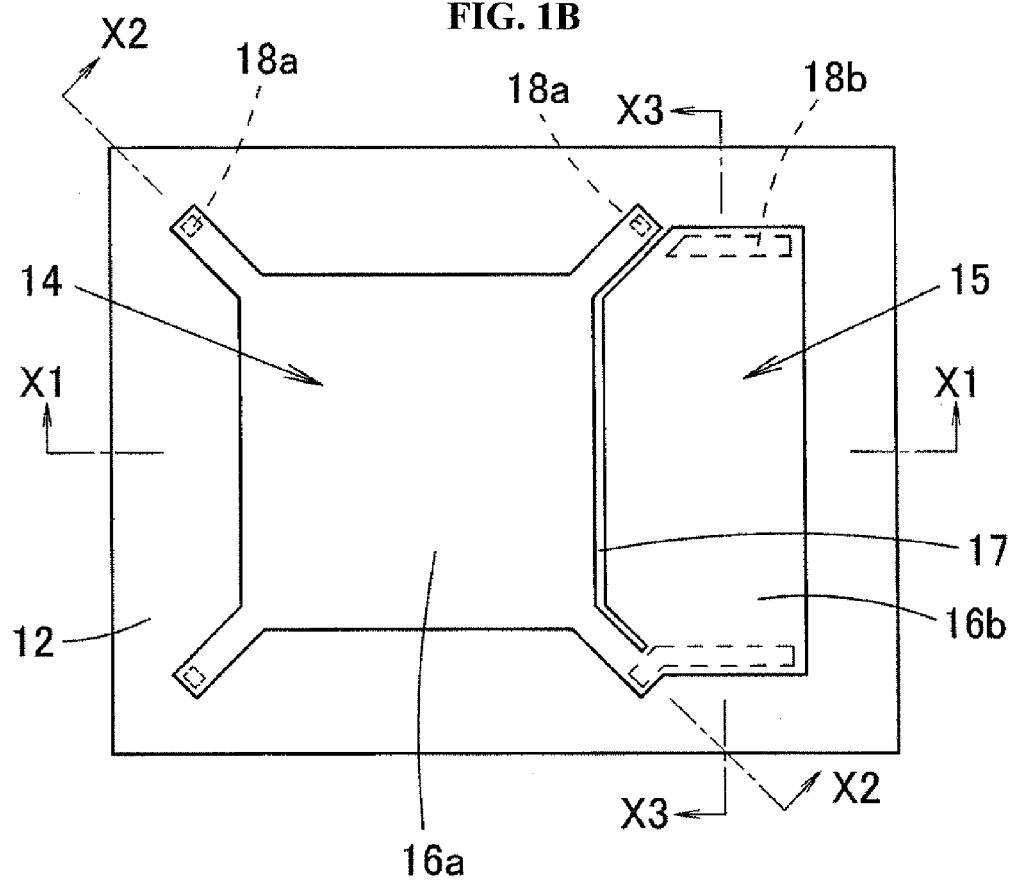
FIG. 1B is a plan view of the acoustic sensor in FIG. 1A in a state in which the back plate has been removed.
Figure 2:
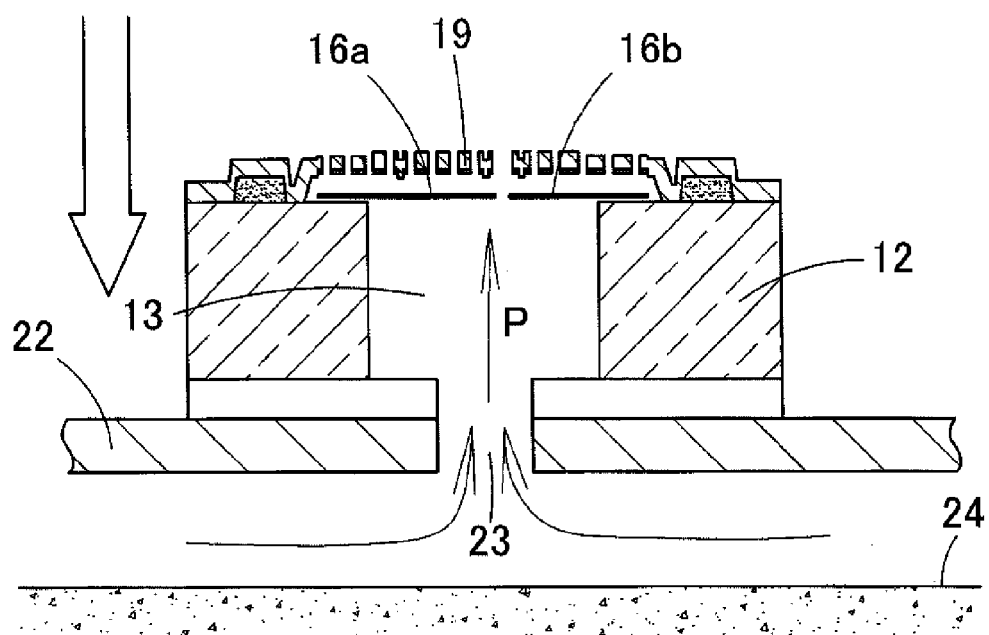
FIG. 2 is a schematic diagram illustrating a state in which the acoustic sensor in FIG. 1A is dropped.
Figure 3A:
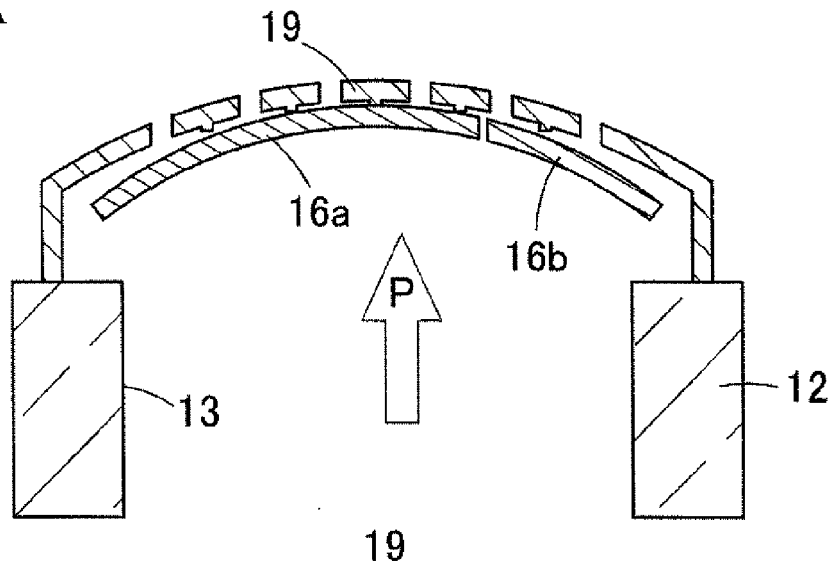
FIG. 3A is a schematic cross-sectional diagram taken along a line X1-X1 in FIG. 1B.
Figure 3B:
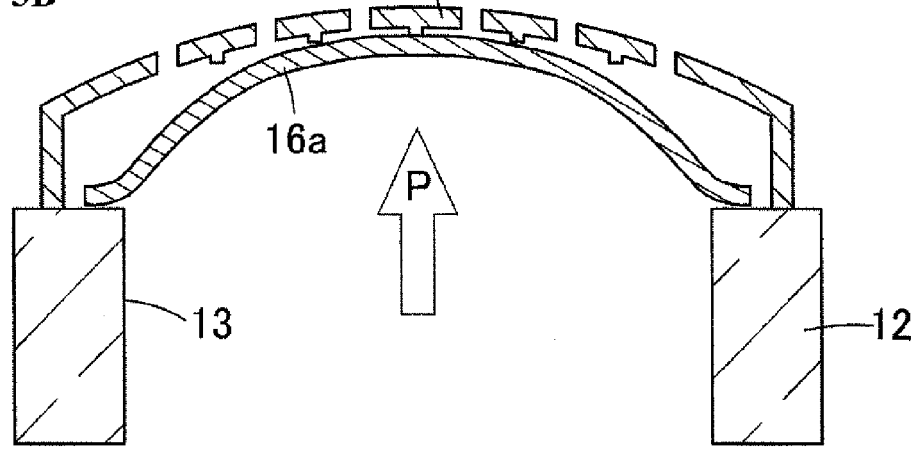
FIG. 3B is a schematic cross-sectional diagram taken along a line X2-X2 in FIG. 1B.
Figure 3C:
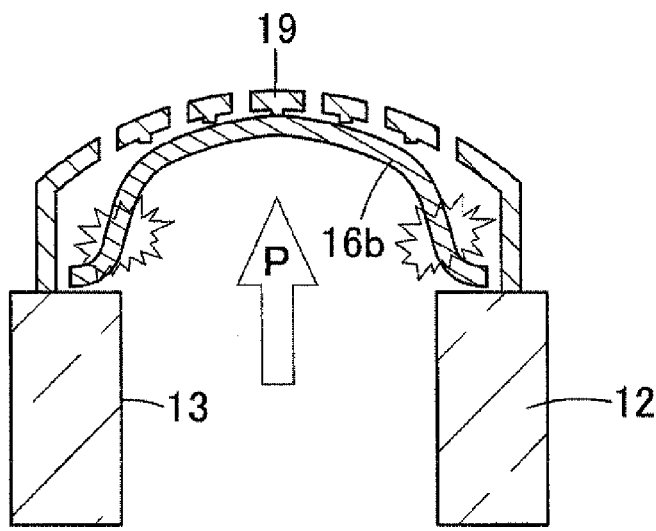
FIG. 3C is a schematic cross-sectional diagram taken along a line X3-X3 in FIG. 1B.
Figure 4:
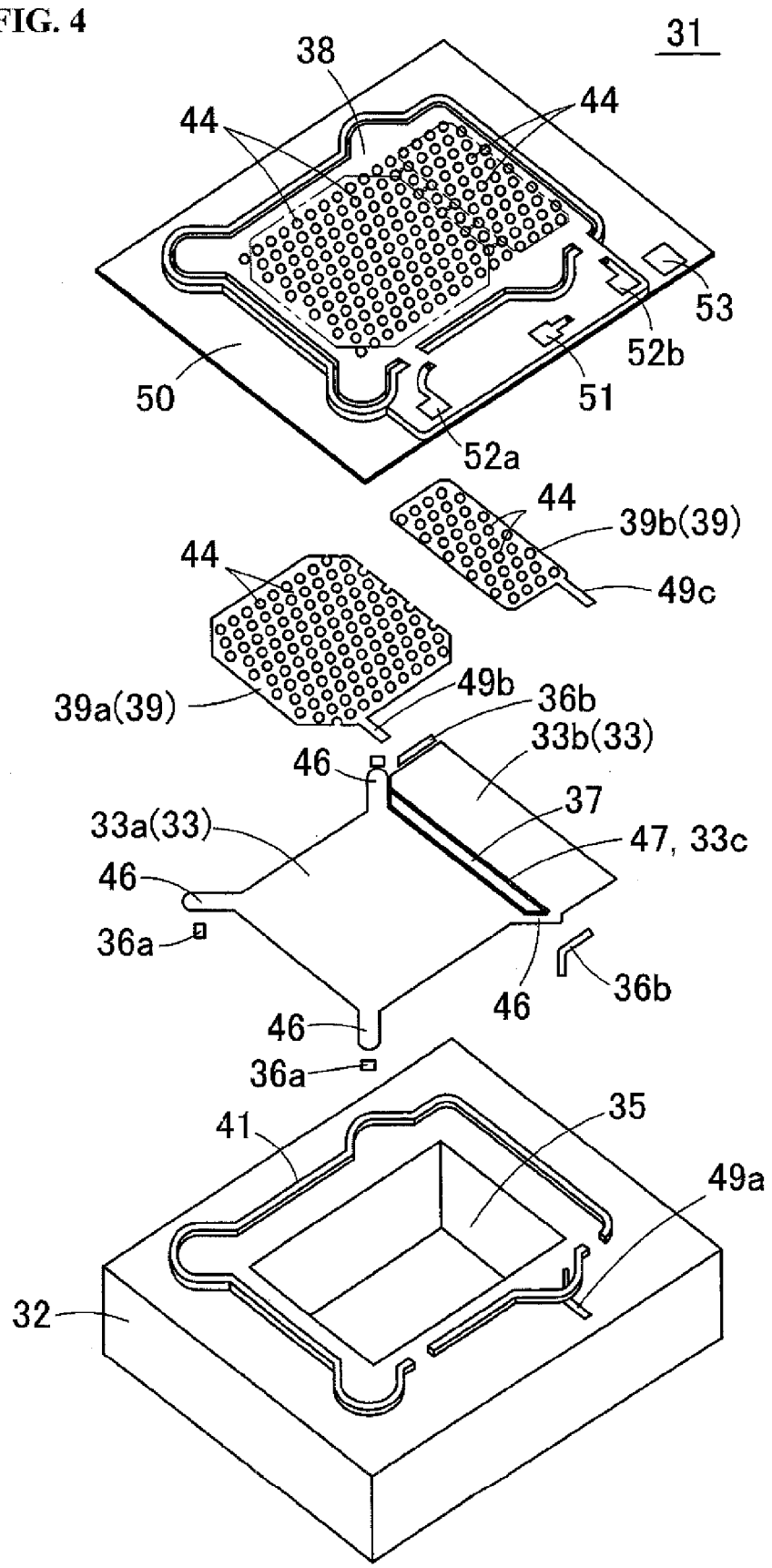
FIG. 4 is an exploded perspective view of an acoustic sensor according to Embodiment 1 of the present invention.
Figure 5:
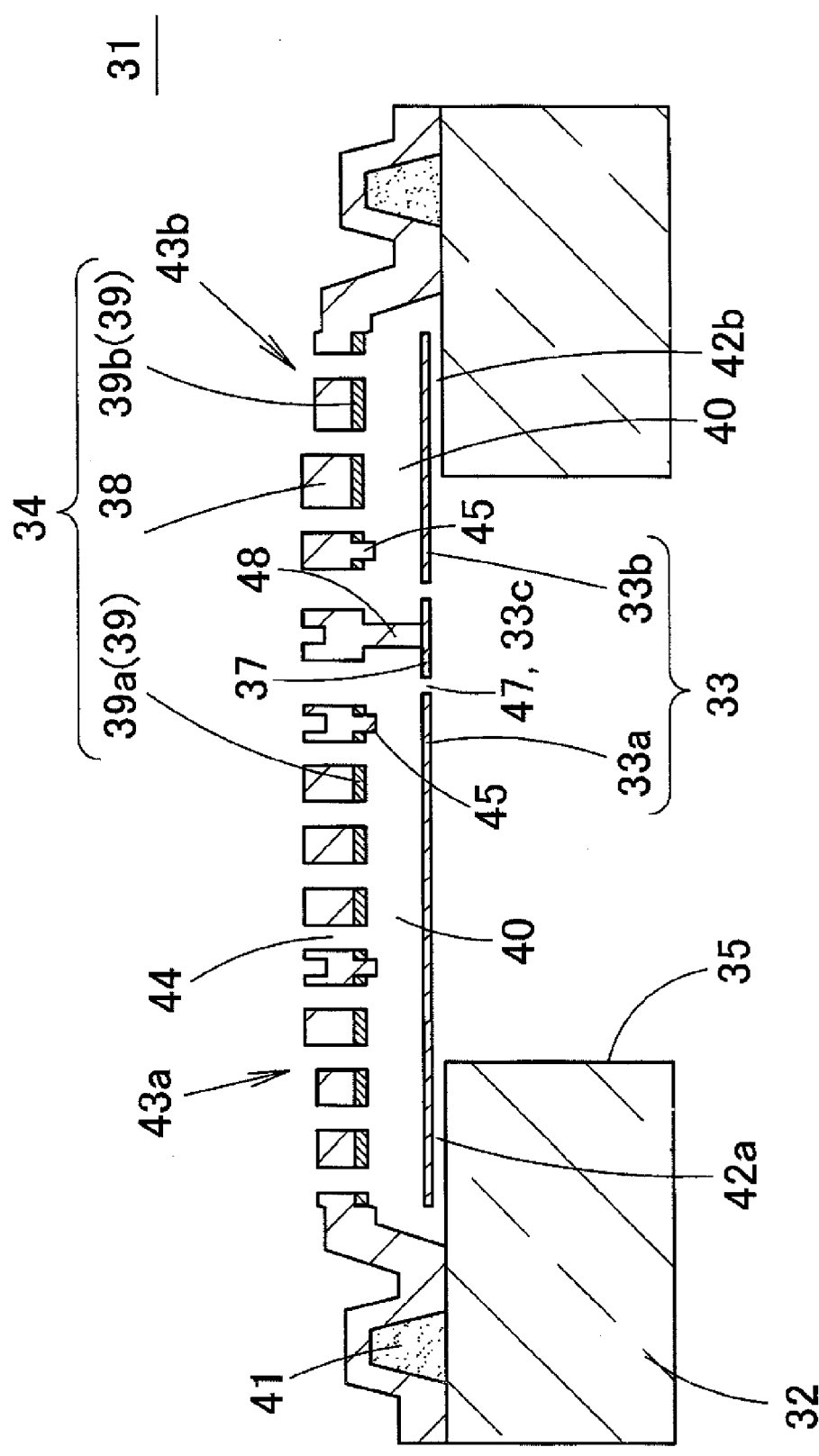
FIG. 5 is a cross-sectional view of the acoustic sensor shown in FIG. 4.
Figure 6:
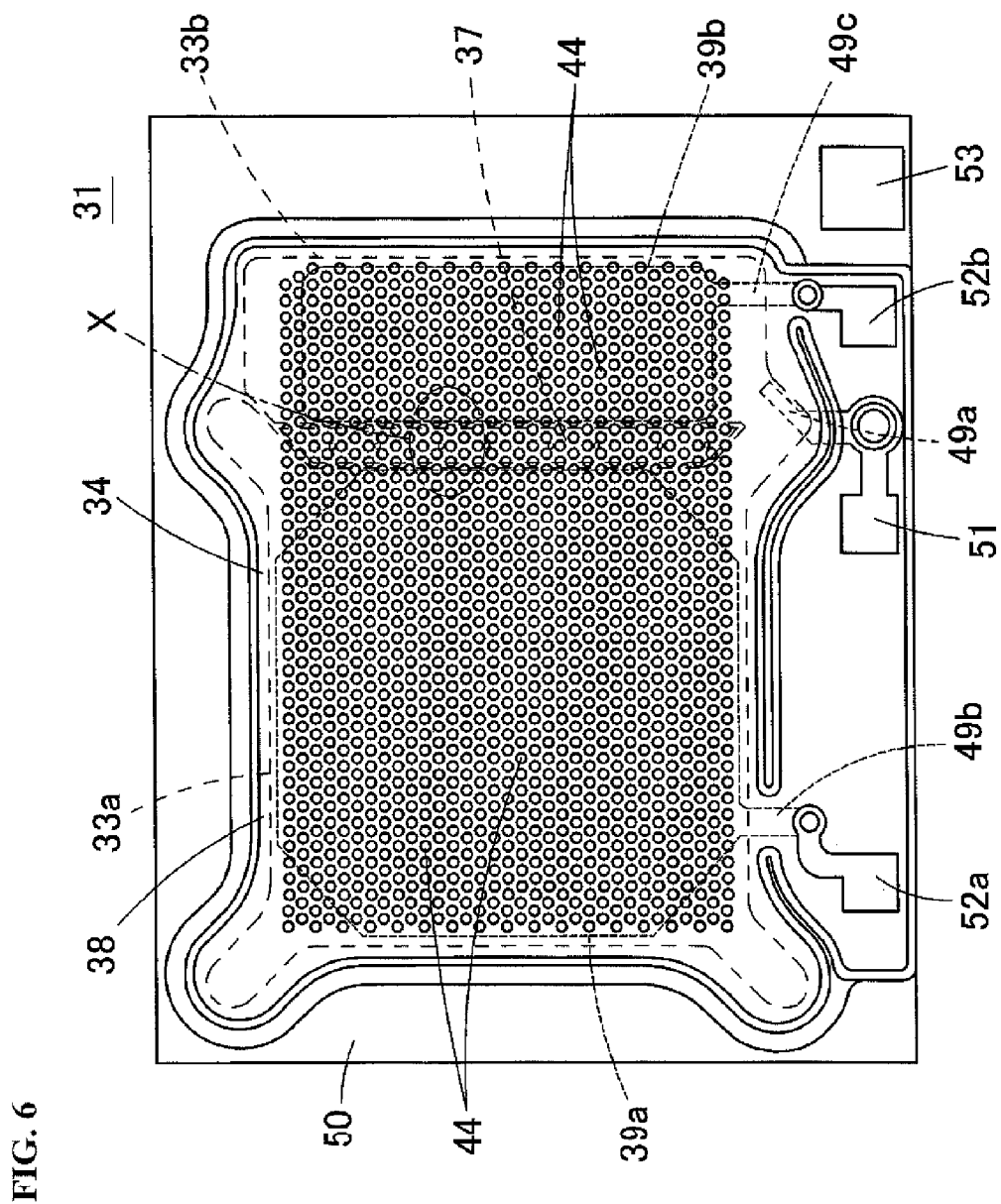
FIG. 6 is a plan view of the acoustic sensor shown in FIG. 4.
Figure 7:
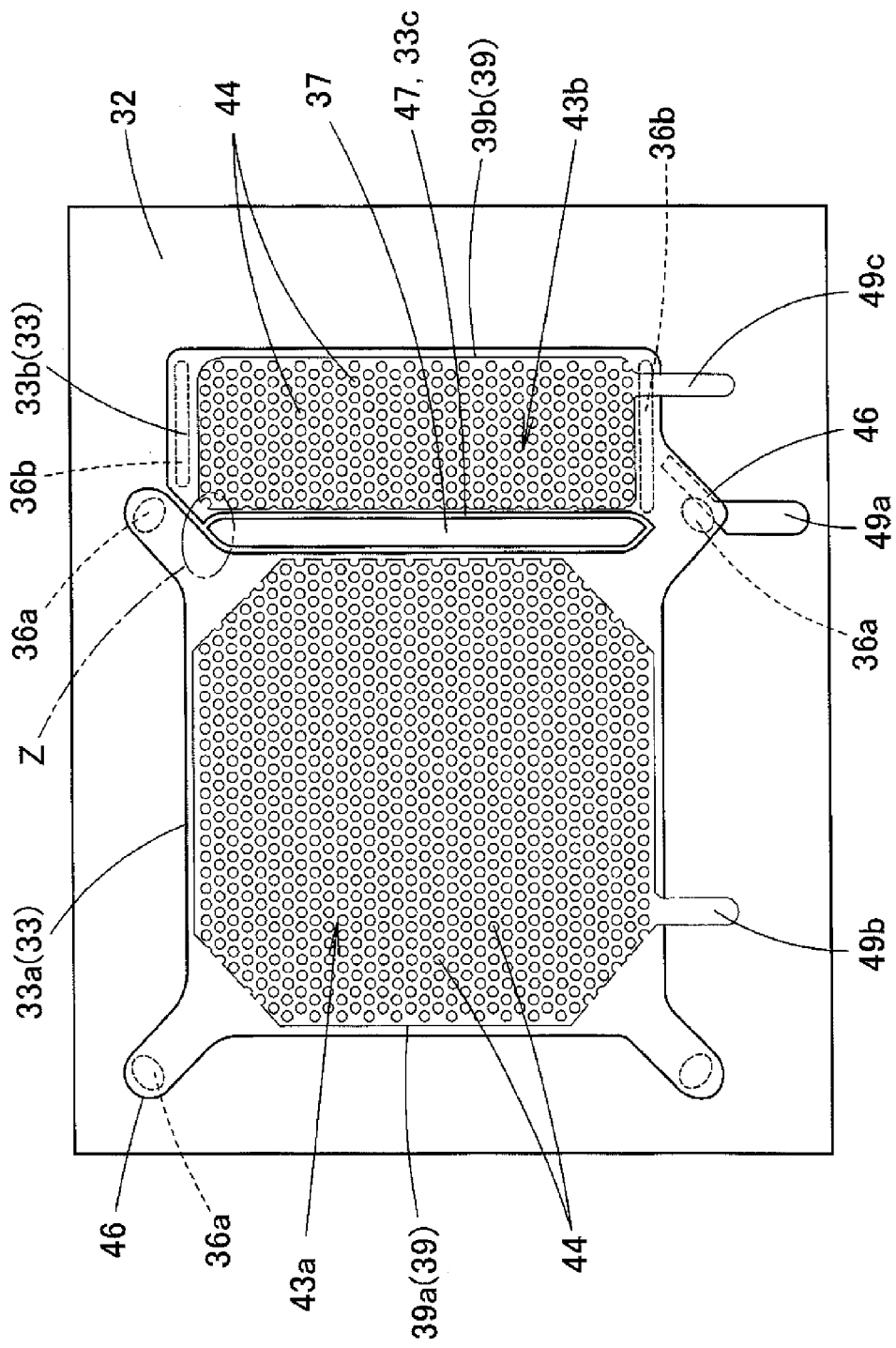
FIG. 7 is a plan view showing a state in which a back plate, a protective film, and the like have been removed from the acoustic sensor shown in FIG. 6.

The following describes the structure of an acoustic sensor according to Embodiment 1 of the present invention with reference to FIGS. 4 to 7. FIG. 4 is an exploded perspective view of an acoustic transducer according to Embodiment 1 of the present invention, that is to say an acoustic sensor 31. FIG. 5 is a cross-sectional diagram of the acoustic sensor 31. FIG. 6 is a plan view of the acoustic sensor 31. FIG. 7 is a plan view of the acoustic sensor 31 from which a back plate 38, a protective film 50, and the like have been removed, and shows a state in which a diaphragm 33 (vibrating electrode plate) and a fixed electrode plate 39 are overlapped with each other above a substrate 32.

The acoustic sensor 31 is a capacitance type of device created using MEMS technology. As shown in FIGS. 4 and 5, in the acoustic sensor 31, the diaphragm 33 is provided on the upper surface of a substrate 32, which is made of a silicon substrate or the like, via anchors 36*a* and 36*b*, a canopy portion 34 is arranged above the diaphragm 33 via a very small air gap 40, and the canopy portion 34 is fixed to the upper surface of the substrate 32.

A cavity 35 (front chamber, back chamber) is formed in the substrate 32 so as to pass from the upper surface to the lower surface. Although the cavity 35 shown here is surrounded by surfaces that are perpendicular to the upper surface of the substrate 32, the wall surfaces of the cavity 35 may be surfaces that are inclined with respect to the upper surface of the substrate 32.

The diaphragm 33 is arranged above the substrate 32 so as to cover the cavity 35. As shown in FIGS. 4 and 7, the diaphragm 33 is formed in a substantially rectangular shape. The diaphragm 33 is formed by a conductive polysilicon thin film, and the diaphragm 33 itself serves as a vibrating electrode plate. A void portion for allowing pressure to escape, that is to say an opening 33*c* that extends in a direction parallel to the short sides of the diaphragm 33, is provided in the diaphragm 33, and the diaphragm 33 is divided into a first diaphragm 33*a* and a second diaphragm 33*b* by the opening 33*c*. The first diaphragm 33*a* and the second diaphragm 33*b* are partially connected on one of the long sides of the diaphragm 33. The first diaphragm 33*a* and the second diaphragm 33*b* are both substantially rectangular, and the first diaphragm 33*a* has a larger area than the second diaphragm 33*b*.

Leg pieces 46 provided in corner portions of the first diaphragm 33*a* are supported on the upper surface of the substrate 32 by anchors 36*a*, and thus the first diaphragm 33*a* is supported so as to float above the upper surface of the substrate 32. Between the adjacent anchors 36*a*, a narrow vent hole 42*a* for allowing the passage of acoustic vibration is formed between the upper surface of the substrate 32 and the lower surface of the outer peripheral portion of the first diaphragm 33*a*.

The two short sides of the second diaphragm 33*b* are supported on the upper surface of the substrate 32 by anchors 36*b*, and thus the second diaphragm 33*b* is supported so as to float above the upper surface of the substrate 32. A narrow vent hole 42*b* for allowing the passage of acoustic vibration is formed between the upper surface of the substrate 32 and the lower surface of a long side of the second diaphragm 33*b*. The vent hole 42*a* and the vent hole 42*b* are gaps having the same height.

A leak pressure regulation portion 37 (referred to hereinafter as simply the regulation portion 37) made of a polysilicon thin film is provided in the opening 33*c* between the first diaphragm 33*a* and the second diaphragm 33*b*. As shown in FIG. 5, the regulation portion 37 is supported horizontally below the later-described back plate 38 by multiple support portions 48 that extend downward from the back plate 38. A slit-shaped gap, that is to say a slit 47 (a portion of the opening 33*e*), is formed over the entire circumference of the regulation portion 37, and thus the regulation portion 37 is completely separated from the first diaphragm 33*a* by the slit 47, and also completely separated from the second diaphragm 33*b* by the slit 47.

A lead-out interconnect 49*a* provided on the upper surface of the substrate 32 is connected to the diaphragm 33. Furthermore, a strip-shaped base portion 41 is formed on the upper surface of the substrate 32 so as to surround the diaphragm 33. The anchors 36*a* and 36*b* and the base portion 41 are formed by $SiO_2$.

As shown in FIG. 5, the canopy portion 34 is obtained by providing the fixed electrode plate 39, which is made of a conductive polysilicon thin film, on the lower surface of the back plate 38, which is made of SiN. The canopy portion 34 is shaped as a dome and has a cavity portion on its underside, and the diaphragm 33 is covered by the cavity portion. A very small air gap 40 is formed between the lower surface of the fixed electrode plate 39 and the upper surface of the diaphragm 33.

The fixed electrode plate 39 is divided into a first fixed electrode plate 39*a* that opposes the first diaphragm 33*a* and a second fixed electrode plate 39*b* that opposes the second diaphragm 33*b*, and the fixed electrode plates 39*a* and 39*b* are electrically separated from each other. The first fixed electrode plate 39*a* has a larger area than the second fixed electrode plate 39*b*. A lead-out interconnect 49*b* extends from the first fixed electrode plate 39*a*, and a lead-out interconnect 49*c* extends from the second fixed electrode plate 39*b*.

A first acoustic sensing portion 43*a* having a capacitor structure is formed by the first diaphragm 33*a* and the first fixed electrode plate 39*a* that oppose each other across the air gap 40. Also, a second acoustic sensing portion 43*b* having a capacitor structure is formed by the second diaphragm 33*b* and the second fixed electrode plate 39*b* that oppose each other across the air gap 40. The gap distance of the air gap 40 in the first acoustic sensing portion 43*a* is the same as the gap distance of the air gap 40 in the second acoustic sensing portion 43*b*.

A large number of acoustic holes 44 for allowing acoustic vibration to pass are formed in the back plate 38 and the fixed electrode plate 39 so as to pass from the upper surface to the lower surface. Note that in the illustrated example, the hole diameter and pitch of the acoustic holes 44 are the same in the first acoustic sensing portion 43*a* and the second acoustic sensing portion 43*b*, but there are cases where the hole diameter and pitch of the acoustic holes 44 are different in the two acoustic sensing portions 43*a* and 43*b*.

As shown in FIGS. 6 and 7, the acoustic holes 44 are in a regular arrangement in both of the two acoustic sensing portions 43*a* and 43*b*. The acoustic holes 44 are arranged in a triangular shape along three directions that form 120° angles with each other in the illustrated example, but they may be arranged in a rectangular shape, concentric circles, or the like.

As shown in FIG. 5, in both the first acoustic sensing portion 43*a* and the second acoustic sensing portion 43*b*, very small stoppers 45 (protrusions) shaped as circular columns project from the lower surface of the canopy portion 34. The stoppers 45 integrally project from the lower surface of the back plate 38, pass through the first and second fixed electrode plates 39*a* and 39*b*, and project from the lower surface of the canopy portion 34. The stoppers 45 are insulating due to being made of SiN likewise to the back plate 38. The stoppers 45 are for preventing the diaphragms 33*a* and 33*b* from adhering to and not separating from the fixed electrode plates 39*a* and 39*b* due to electrostatic force. Also, multiple support portions 48 extend downward from locations opposing the regulation portion 37 as described above, and the regulation portion 37 is horizontally supported on the lower ends of the support portions 48.

A protective film 50 extends in a continuous manner around the entire circumference of the outer peripheral edge of the canopy-shaped back plate 38. The protective film 50 covers the base portion 41 and the surface of the silicon substrate outward thereof.

A common electrode pad 51, a first electrode pad 52a, a second electrode pad 52b, and a grounding electrode pad 53 are provided on the upper surface of the protective film 50. The other end of the lead-out interconnect 49a connected to the diaphragm 33 is connected to the common electrode pad 51. The lead-out interconnect 49b extending from the first fixed electrode plate 39a is connected to the first electrode pad 52a, and the lead-out interconnect 49c extending from the second fixed electrode plate 39b is connected to the second electrode pad 52b. Also, the grounding electrode pad 53 is connected to the substrate 32 and held at ground potential.

Figure 9:
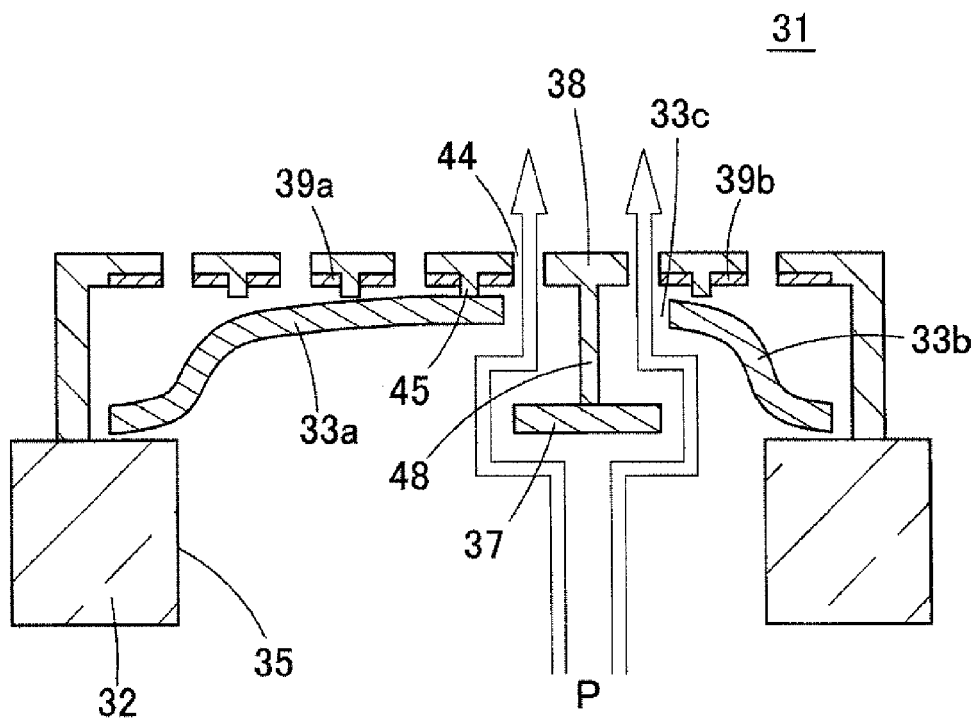
FIG. 9 is a schematic cross-sectional diagram of the acoustic sensor according to Embodiment 1 of the present invention, in a state in which high-load pressure is being applied to the diaphragms.

Next, operations when the acoustic sensor 31 detects acoustic vibration and operations of the acoustic sensor 31 when a large degree of high-load pressure is applied to the diaphragm 33 will be described. FIG. 5 is a cross-sectional diagram of the acoustic sensor 31 in a state in which high-load pressure is not being applied to the diaphragm 33. FIG. 9 is a schematic cross-sectional diagram of the acoustic sensor 31 in a state in which high-load pressure is being applied to the diaphragm 33.

In the case where the acoustic sensor 31 is not being subjected to a large degree of high-load pressure and is detecting only acoustic vibration, the diaphragm 33 vibrates upward and downward with a small amplitude, centered about the flat state shown in FIG. 5. When the diaphragms 33a and 33b vibrate in response to acoustic vibration that entered the acoustic sensor 31 from the cavity 35, a change occurs in the capacitance of the variable capacitor configured by the first fixed electrode plate 39a and the first diaphragm 33a (the capacitance of the first acoustic sensing portion 43a), and a change occurs in the capacitance of the variable capacitor configured by the second fixed electrode plate 39b and the second diaphragm 33b (the capacitance of the second acoustic sensing portion 43b). As a result, in the acoustic sensing portions 43a and 43b, the acoustic vibration (change in sound pressure) detected by the diaphragms 33a and 33b becomes change in the respective capacitances and is output as electrical signals with different sensitivities.

Also, since the area of the second diaphragm 33b is smaller than the area of the first diaphragm 33a, the second acoustic sensing portion 43b is a low-sensitivity acoustic sensor for a sound pressure range of mid volume to high volume, and the first acoustic sensing portion 43a is a high-sensitivity acoustic sensor for a sound pressure range of low volume to mid volume. Accordingly, the two acoustic sensing portions 43a and 43b are hybridized and output signals by processing circuits, thus making it possible to widen the dynamic range of the acoustic sensor 31. For example, assuming that the dynamic range of the first acoustic sensing portion 43a is approximately 30 to 120 dB, and that the dynamic range of the second acoustic sensing portion 43b is approximately 50 to 140 dB, combining the two acoustic sensing portions 43a and 43b makes it possible to widen the dynamic range to approximately 30 to 140 dB. Also, if the acoustic sensor 31 is divided into the first acoustic sensing portion 43a for range of low volume to mid volume and the second acoustic sensing portion 43b for the range of mid volume to high volume, it is possible to not use the output of the first acoustic sensing portion 43a in the case of a high volume, and therefore there may be no issues even if there is a large amount of harmonic distortion in the large sound pressure range of the first acoustic sensing portion 43a. Accordingly, it is possible to raise the sensitivity of the first acoustic sensing portion 43a with respect to low volume.

Furthermore, in the acoustic sensor 31, the first acoustic sensing portion 43a and the second acoustic sensing portion 43b are formed on the same substrate. Moreover, the first acoustic sensing portion 43a and the second acoustic sensing portion 43b are configured by the first diaphragm 33a and the second diaphragm 33b obtained by dividing the diaphragm 33, and the first fixed electrode plate 39a and the second fixed electrode plate 39b obtained by dividing the fixed electrode plate 39. In other words, the sensing portion that was originally one sensing portion is divided into two so as to hybridize the first acoustic sensing portion 43a and the second acoustic sensing portion 43b, and therefore the first acoustic sensing portion 43a and the second acoustic sensing portion 43b have similar variation regarding detection sensitivity in comparison to a conventional acoustic sensor in which two independent sensing portions are provided on a single substrate or a conventional acoustic sensor in which sensing portions are provided on separate substrates. As a result, detection sensitivity variation between the two acoustic sensing portions 43a and 43b can be reduced. Also, since the diaphragm and the fixed electrode plate are common to the two acoustic sensing portions 43a and 43b, it is possible to suppress mismatching regarding frequency characteristics and acoustic characteristics such as the phase.

Figure 8:
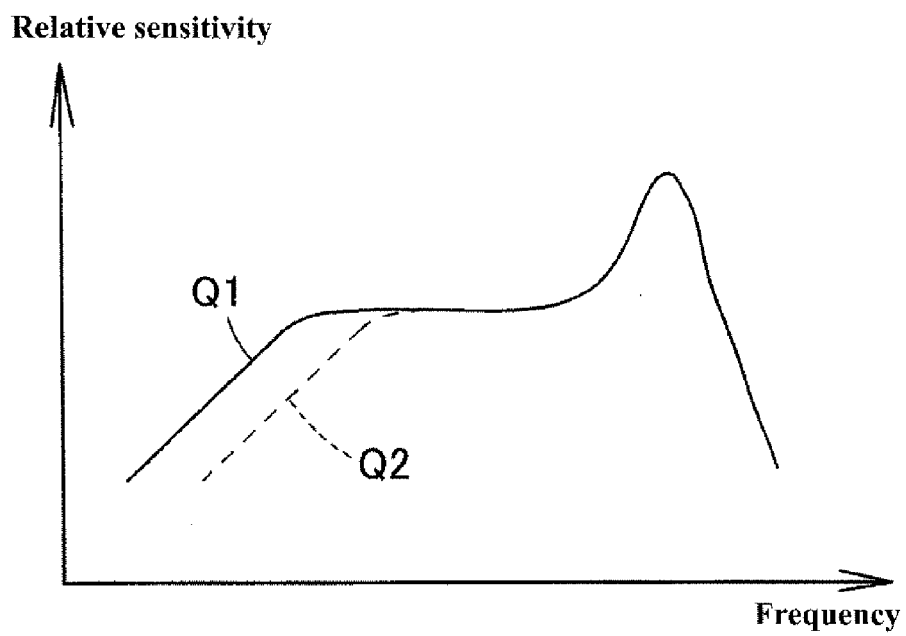
FIG. 8 is a diagram showing typical frequency characteristics in an MEMS microphone.

Next, the relationship between the frequency characteristics of the acoustic sensor 31 and the regulation portion 37 will be described. If the regulation portion 37 were not present, the opening 33c would be in an open state between the first diaphragm 33a and the second diaphragm 33b, and therefore acoustic vibration would be more likely to pass through the opening 33c than pass through the narrow vent holes 42a and 42b. For this reason, acoustic resistance in the acoustic path between the upper side and the lower side of the diaphragm 33 would be smaller. Assume that curve Q1 shown by the solid line in FIG. 8 shows the frequency characteristics of the acoustic sensor in the case where the opening 33c is not formed in the diaphragm 33. In the case where the opening is open, the acoustic resistance decreases, and therefore the sensitivity of the acoustic sensor in the low frequency range decreases as shown by a curve Q2 shown by the dashed line in FIG. 8.

With the acoustic sensor 31 of Embodiment 1, the opening 33c is formed between the first diaphragm 33a and the second diaphragm 33b, but the opening 33c is substantially blocked by the regulation portion 37 in the normal acoustic vibration detection mode, and therefore the leakage of air pressure is hindered by the regulation portion 37, acoustic resistance is not likely to decrease, and the sensitivity of the acoustic sensor in the low frequency range is not likely to decrease.

If the two diaphragms 33a and 33b and the regulation portion 37 are in contact with each other, vibration of the diaphragms 33a and 33b is hindered by the regulation portion 37, and there is the risk of a decrease in the sensitivity of the acoustic sensor 31 and a decrease in the S/N ratio. For this reason, the area of the regulation portion 37 is made somewhat smaller than the opening area of the opening 33c such that the diaphragms 33a and 33b and the regulation portion 37 are separated from each other. Specifically, the slit 47 having a substantially constant width w is provided between the inner peripheral surface of the opening 33c and the outer peripheral surface of the regulation portion 37.

On the other hand, if the width w of the slit 47 is too large, there is the risk that the ventilation effect will intensify, too much air pressure will pass through the slit 47, the roll-off frequency will decrease, and the low frequency characteristics will degrade. This point will be described in detail below.

Aforementioned FIG. 8 shows typical frequency characteristics in a MEMS microphone, and the horizontal axis and the vertical axis in this figure respectively indicate the frequency of acoustic vibration (unit: Hz) and the relative sensitivity (unit: dB/dB). In FIG. 8, the range in which the plotted line is horizontal is a range in which sound waves can be favorably detected since the relative sensitivity is not dependent on the frequency of the sound waves. The frequency at the lower limit of this range will be referred to as the roll-off frequency f roll-off.

In general, the roll-off frequency f roll-off is dependent on the acoustic resistance R venthole in the acoustic vibration path and the compliance of air in the cavity 35 (air spring constant) C chamber, and is expressed by the following expression.

$$f \text{ roll-off} \propto 1/(R \text{ venthole} \times C \text{ chamber}) \qquad \text{Exp. 1}$$

The acoustic resistance R venthole is also influenced by the length of the slit 47, and decreases as the width w of the slit 47 increases. Therefore, according to Exp. 1 above, the roll-off frequency f roll-off will increase, and the low frequency characteristics will degrade as a result. For example, if the width w of the slit 47 is 10 µm, the roll-off frequency f roll-off will be 500 Hz or more. For this reason, if the width w of the slit 47 exceeds 10 µm, the low frequency characteristics degrade significantly, and sound quality is impaired. It is therefore desirable that the width w of the slit 47 is less than or equal to 10 µm.

Next, the state in which high-load pressure is applied to the first diaphragm 33a and the second diaphragm 33b of the acoustic sensor 31 will be described with reference to FIG. 9. The diaphragms 33a and 33b are subjected to a large degree of high-load pressure P in cases such as where the acoustic sensor 31 is subjected to a drop test, the device that includes the acoustic sensor 31 is dropped, or air is forcefully blown into the acoustic sensor 31. When a large degree of pressure is applied to the acoustic sensor 31 from the cavity 35 side, the first diaphragm 33a and the second diaphragm 33b are subjected to the large degree of pressure P and undergo large deformation due to having a low elasticity and being flexible. In contrast, the regulation portion 37 is supported by the support portions 48, and therefore does not move along with the two diaphragms 33a and 33b. Also, since the regulation portion 37 has a smaller area than the diaphragms 33a and 33b and is rigid, the regulation portion 37 does not undergo deformation along with the diaphragms 33a and 33b even when subjected to a large degree of pressure. For this reason, when the first diaphragm 33a and the second diaphragm 33b undergo large deformation, the regulation portion 37 comes out of the opening 33c such that the opening 33c is opened, and thus a space is formed for allowing the passage of the pressure P between the outer peripheral surface of the support portions 48 and the edge of the opening 33c. As a result, as shown in FIG. 9, the pressure P escapes to the outside through the opening 33c and the acoustic holes 44, and the pressure applied to the diaphragms 33a and 33b is reduced, and therefore the amount of deformation of the diaphragms 33a and 33b decreases. This reduces the shock that diaphragms 33a and 33b apply to the back plate 38, a large amount of stress is not likely to be applied to the diaphragms 33a and 33b and the back plate 38, and the diaphragms 33a and 33b and the back plate 38 are not likely to become damaged or cracked (i.e., the damage resistance improves).

In contrast, although the slit 17 is provided between the first diaphragm 16a and the second diaphragm 16b in the acoustic sensor 11 of JP 2012-147115A as well, if the width of the slit 17 is increased so as to allow a large degree of pressure to escape, the acoustic resistance decreases, and the low frequency characteristics of the acoustic sensor 11 degrade.

Figure 10:
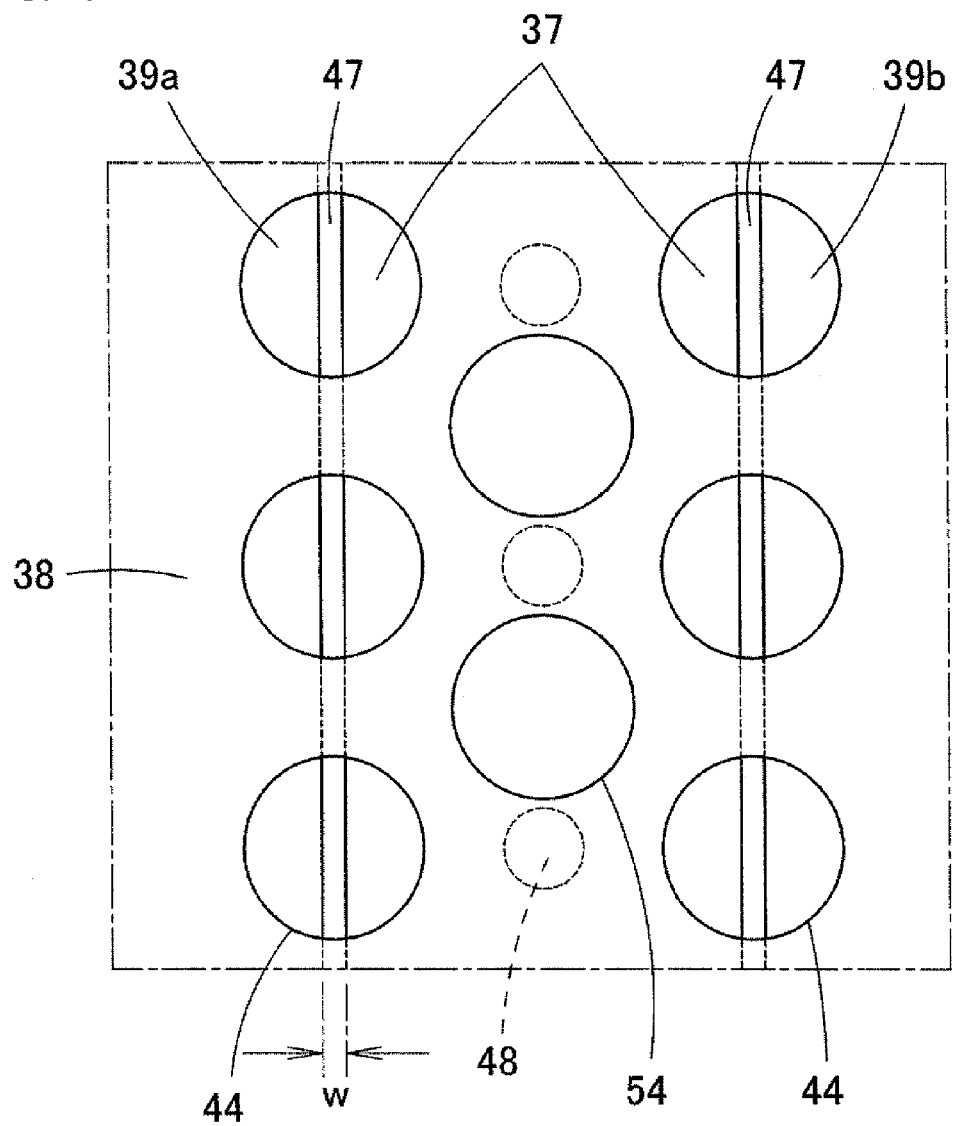
FIG. 10 is a plan view showing an enlargement of a portion Y in FIG. 6.

In the acoustic sensor 31 of Embodiment 1, in order for the pressure P that passed through the opening 33c to smoothly escape to the outside through the acoustic holes 44, it is desirable that a portion of the acoustic holes 44 are overlapped with the slit 47 between the diaphragms 33a and 33b and the regulation portion 37 in a view from a direction perpendicular to the upper surface of the substrate 32 as shown in FIG. 10. If the slit 47 and the acoustic holes 44 are not overlapped with each other, and are out of alignment in the horizontal direction as shown in FIG. 11A, the path for the escape of the pressure P applied to the diaphragms 33a and 33b is long, and it becomes difficult for the pressure P to escape. In contrast, if the slit 47 and the acoustic holes 44 are overlapped with each other as shown in FIG. 11B, the path for the escape of the pressure P applied to the diaphragms 33a and 33b is short, the pressure P easily escapes, and it is possible to efficiently reduce the pressure applied to the diaphragms 33a and 33b.

Also, the regulation portion 37 is suspended from the back plate 38 by multiple support portions 48 arranged along the length direction of the regulation portion 37 as shown in FIG. 10. Furthermore, one or more through-holes 54 are provided in the back plate 38 at respective positions between adjacent support portions 48. The through-holes 54 may be some of the acoustic holes 44. If the regulation portion 37 is supported by multiple support portions 48, the rigidity of the regulation portion 37 can be raised, and regulation portion 37 is less likely to undergo deformation due to high-load pressure P. If the regulation portion 37 undergoes deformation due to the pressure P, the path between the regulation portion 37 and the diaphragms 33a and 33b becomes narrower, but if the rigidity of the regulation portion 37 is raised so as to make it less likely to undergo deformation, the path of the pressure P can be ensured. Moreover, providing the through-holes 54 between adjacent support portions 48 makes it possible for the pressure P to escape more efficiently.

Figure 12A:
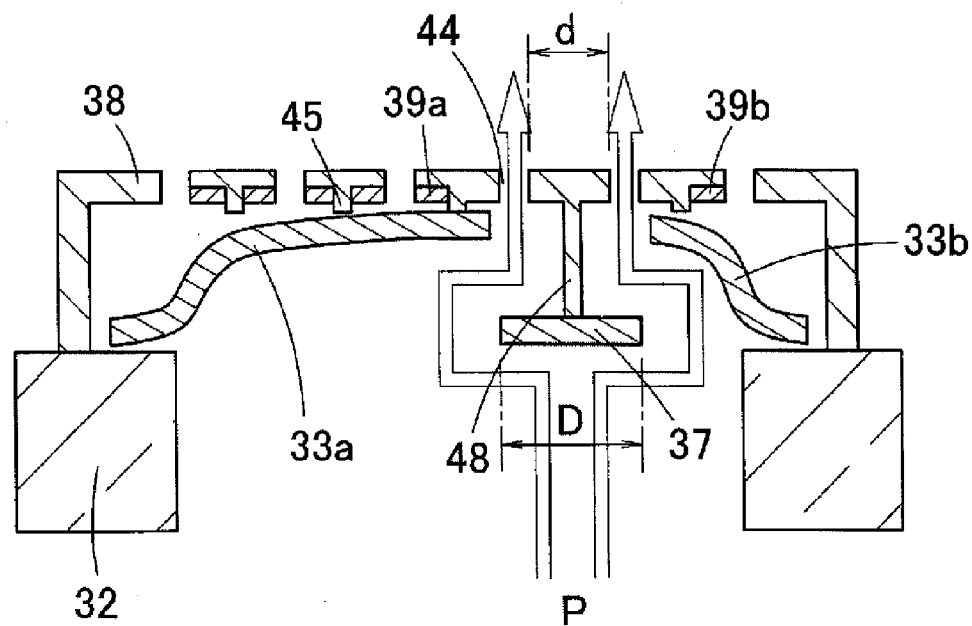
FIG. 12A is a schematic diagram showing a state in which pressure is escaping in an acoustic sensor in which the width of a leak pressure regulation portion is larger than the distance between adjacent acoustic holes.
Figure 12B:
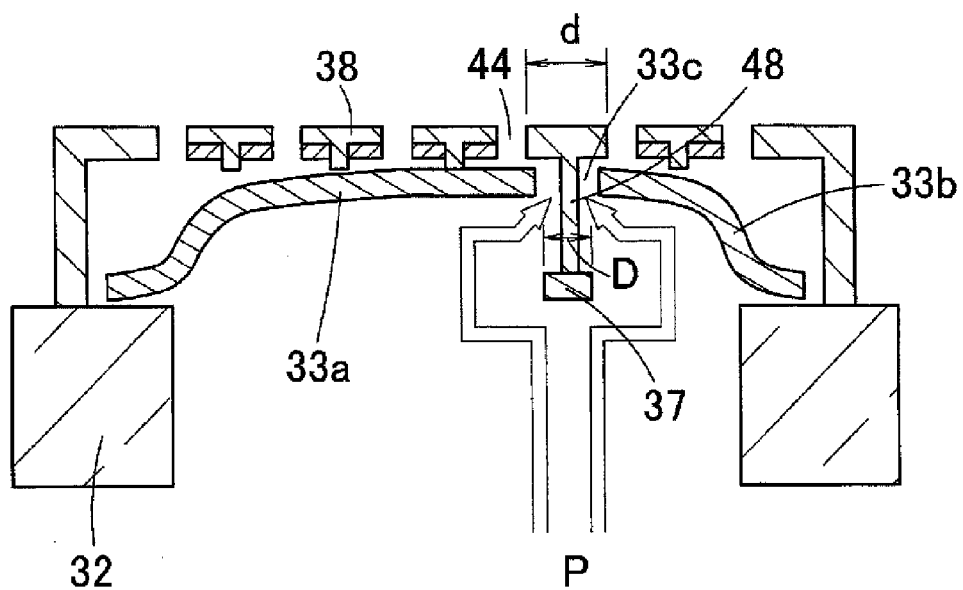
FIG. 12B is a schematic diagram showing a state in which pressure is escaping in an acoustic sensor in which the width of a leak pressure regulation portion is smaller than the distance between adjacent acoustic holes.

Also, the cross-sectional area of the support portions 48 is smaller than the area of the regulation portion 37, and in particular, the diameter of the support portions 48 is shorter than the width of the regulation portion 37. According to this configuration, as shown in FIG. 9, it is possible to widen the path that is for allowing the pressure P to escape and is formed between the outer peripheral surface of the support portions 48 and the edges of the deformed first diaphragm 33a and second diaphragm 33b. Furthermore, as shown in FIG. 12A, the width D of the regulation portion 37 is greater than the distance d between adjacent acoustic holes 44 (distance between their edges). This is because if the width D of the regulation portion 37 is smaller than the distance d between adjacent acoustic holes 44 (distance between their edges) as shown in FIG. 12B, the acoustic holes 44 are blocked by the edges of the diaphragms 33a and 33b, and the path for allowing the escape of the pressure P is blocked.

Figure 13:
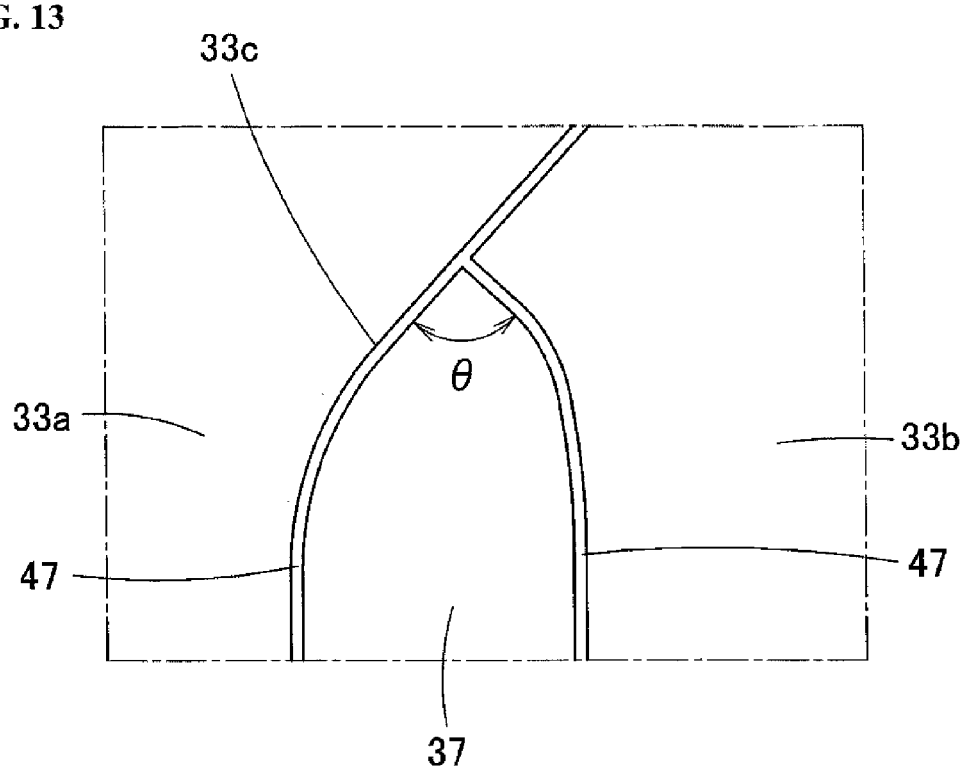
FIG. 13 is an enlarged view of a portion Z in FIG. 7.
Figure 14A:
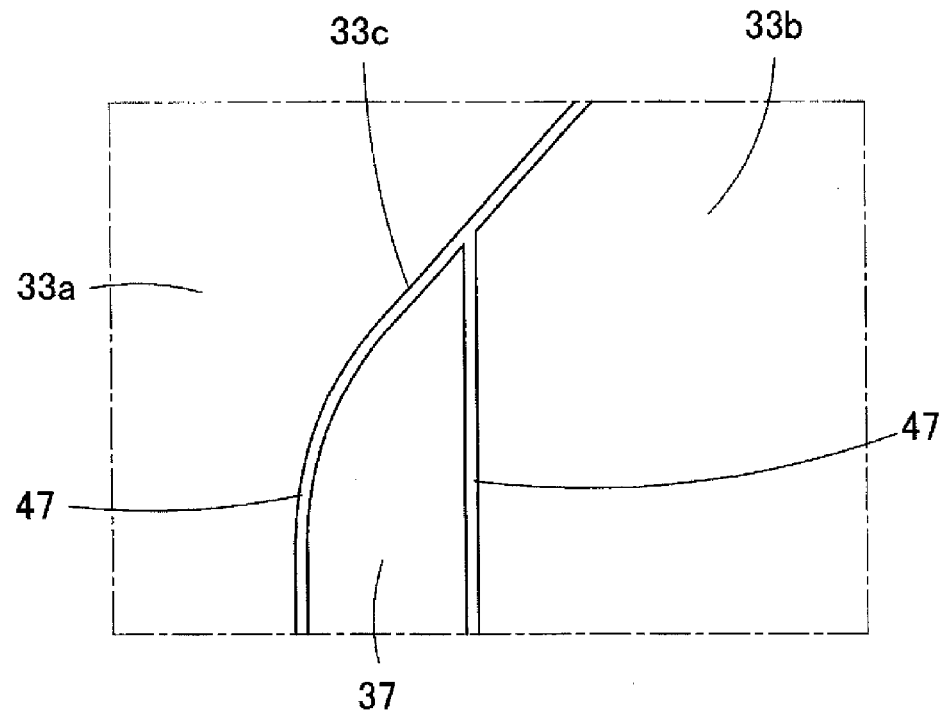
FIG. 14A is a schematic diagram showing a state in which slits are acutely angled with respect to each other.
Figure 14B:
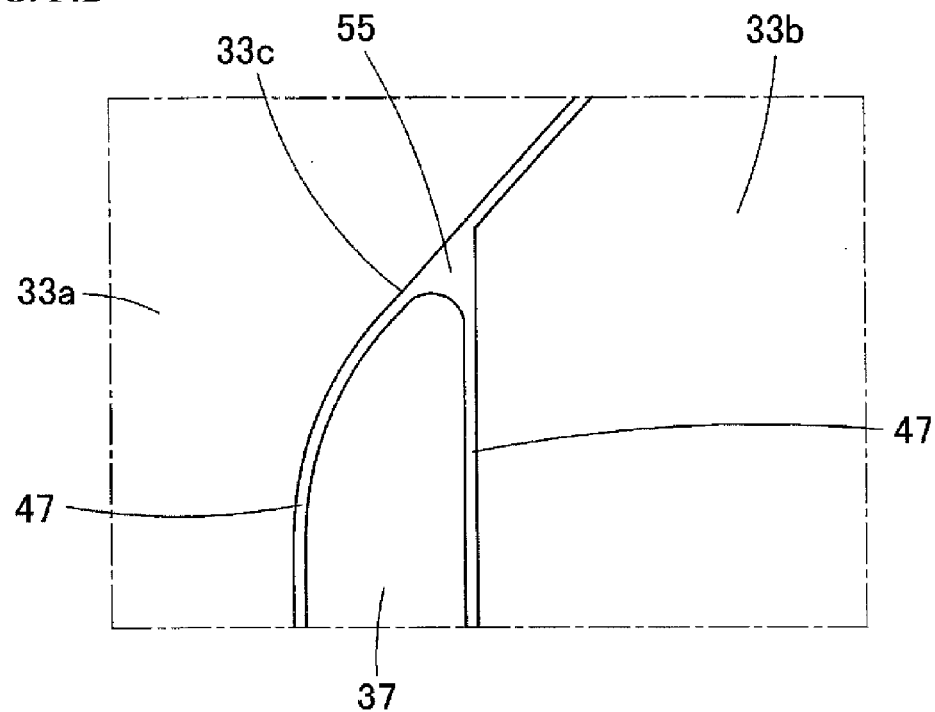
FIG. 14B is a schematic diagram showing a state in which the acutely angled portion in FIG. 14A has been rounded.

Also, FIG. 13 is an enlarged view of a portion Z in FIG. 7. It is desirable that the angle of intersection θ between the end portion of the slit 47 formed between the edge of the first diaphragm 33a and the regulation portion 37 and the end portion of the slit 47 formed between the edge of the second diaphragm 33b and the regulation portion 37 is substantially 90° as shown in FIG. 13. If the intersection between the portions of the slit 47 is acutely angled as shown in FIG. 14A, there is the possibility of breakdown of the stacked thin-film structure including the polysilicon thin film, a sacrifice layer, and the like in the manufacturing process due to residual stress in the polysilicon thin film making up the diaphragm 33 and the regulation portion 37 in the manufacturing process for the acoustic sensor 31. Also, if the acutely angled location in FIG. 14A is rounded as shown in FIG. 14B in order to mitigate the concentration of stress in the polysilicon thin film, a region 55 having a large opening area is formed in the slit 47, acoustic vibration is likely to leak from this region, and the characteristics of the acoustic sensor 31 in the low frequency range degrade. In contrast, if portions of the slit 47 are gradually curved such that end portions of the slit 47 intersect at an angle of approximately 90° as shown in FIG. 13, the concentration of stress in the polysilicon thin film (regulation portion 37) can be mitigated without allowing degradation of the characteristics of the acoustic sensor 31 in the low frequency range.

Next, as is shown in FIGS. 5 and 9, it is desirable that neither the first fixed electrode plate 39a nor the second fixed electrode plate 39b is provided in a region that is overlapped with the regulation portion 37 in a view from a direction perpendicular to the upper surface of the substrate 32. This is because the parasitic capacitance generated between the regulation portion 37 and the fixed electrode plate 39 increases if they oppose each other.

Also, since the regulation portion 37 is arranged between the first diaphragm 33a and the second diaphragm 33b in Embodiment 1, the distance between the first acoustic sensing portion 43a and the second acoustic sensing portion 43b can be increased. In particular, the distance between the first diaphragm 33a and the second fixed electrode plate 39b and the distance between the second diaphragm 33b and the first fixed electrode plate 39a can be increased. As a result, it is possible to reduce mutual interference between signals from the first acoustic sensing portion 43a and the second acoustic sensing portion 43b, and to reduce the harmonic distortion rate of the acoustic sensor 31. Furthermore, since the regulation portion 37 is arranged between the first diaphragm 33a and the second diaphragm 33b, the opening 33c for the arrangement of the regulation portion 37 can also serve as the opening for separating the diaphragms 33a and 33b from each other, and it is possible to increase the area of the opening 33c for allowing the escape of a high-load pressure P, while also reducing the size of the acoustic sensor 31 by logically arranging the opening 33c. Moreover, the regulation portion 37 and the opening 33c can be arranged without a large decrease in the area (electrode area) of the first diaphragm 33a and the second diaphragm 33b, thus making it possible to reduce a decrease in the sensitivity of the acoustic sensor 31 even if the size of the acoustic sensor 31 is the same.

Also, in Embodiment 1, when the diaphragm 33 is not undergoing deformation, the diaphragm 33 and the regulation portion 37 are in the same plane and are merely separated by the slit 47, and therefore the diaphragm 33 and the regulation portion 37 can be created using the same material and using the same film formation process, thus making it possible to simplify the manufacturing process.

Moreover, since the slit 47 can be formed by performing photolithography one time and etching one time, the slit 47 can be formed so as to have a narrow width, and the acoustic resistance can be reduced.

Furthermore, a portion of the stoppers 45 are arranged in a region of the lower surface of the back plate 38 that opposes the edge portions of the first diaphragm 33a and the second diaphragm 33b (particularly the regions that undergo large deformation). If stoppers 45 are provided at these positions, it is possible to prevent the diaphragms 33a and 33b from adhering to and not separating from the fixed electrode plates 39a and 39b when they have undergone large deformation due to a large degree of pressure P.

Variations of Embodiment 1

Figure 15A:
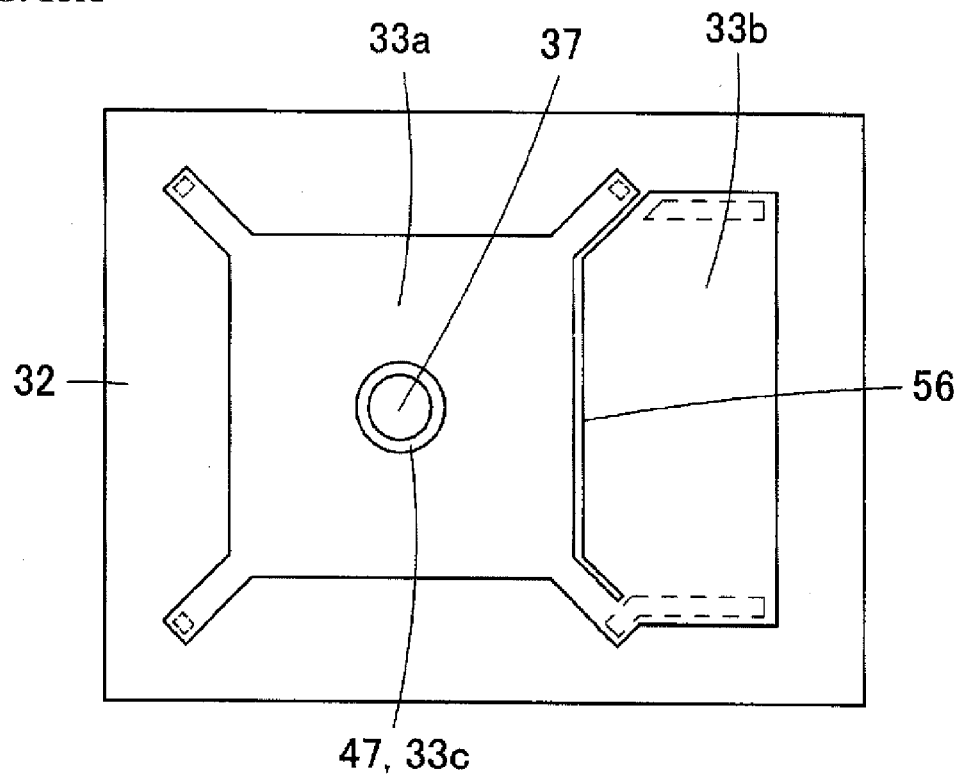
FIG. 15A is a plan view showing an acoustic sensor according to a variation of Embodiment 1 of the present invention, in a state in which the back plate has been removed.

A variation of Embodiment 1 of the present invention will be described below with reference to FIGS. 15 to 18. FIG. 15A is a plan view showing an acoustic sensor according to a variation of Embodiment 1 of the present invention, in a state in which the back plate has been removed. In this variation, a circular opening 33c is provided in the substantially central portion of the first diaphragm 33a. When the first diaphragm 33a is not undergoing deformation, the circular regulation portion 37 provided on the lower end of the support portion 48 extending downward from the back plate 38 is located inside the opening 33c and blocks the opening 33c. Note that a slit-shaped opening 56 is for separating the first diaphragm 33a and the second diaphragm 33b, and extends parallel to the short side direction of the diaphragm 33.

In the variation shown in FIG. 15A, the first diaphragm 33a and the second diaphragm 33b undergo large deformation when high-load pressure is applied to the diaphragm 33, and the regulation portion 37 comes out of the opening 33c when the first diaphragm 33a undergoes deformation. For this reason, the pressure P escapes through the opening 33c, and deformation of the first diaphragm 33a and of course the second diaphragm 33b as well is suppressed.

Figure 15B:
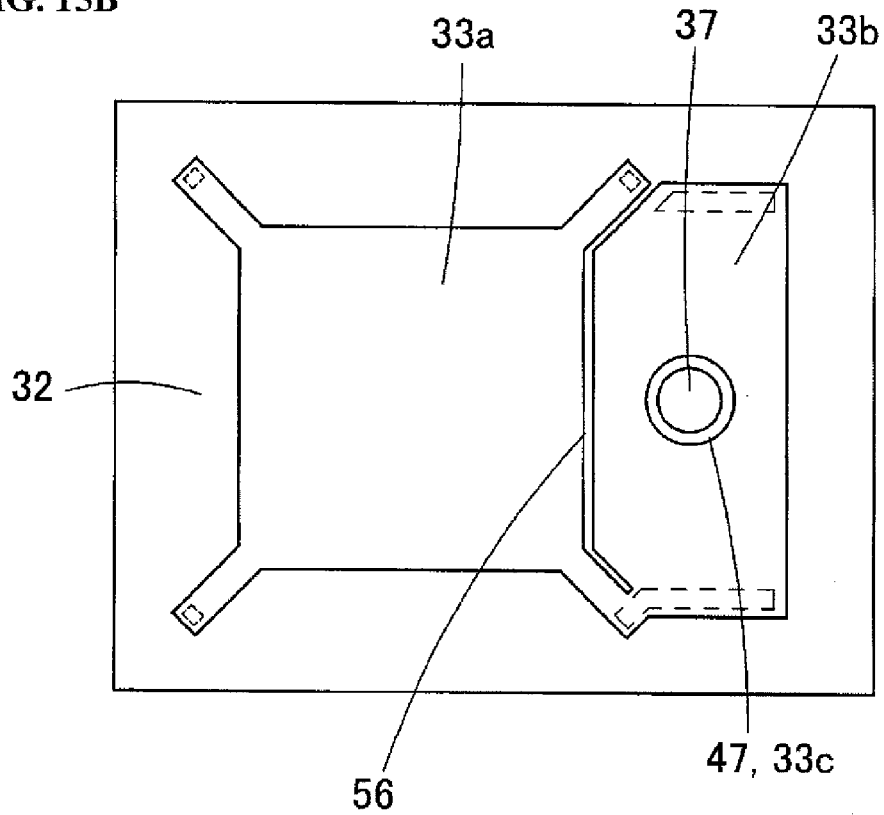
FIG. 15B is a plan view of an acoustic sensor according to another variation of Embodiment 1 of the present invention, in a state in which the back plate has been removed.

Also, the opening 33c and the regulation portion 37 may be provided in the substantially central portion of the second diaphragm 33b as in another variation shown in FIG. 15B. Alternatively, there may be no issues if both the first diaphragm 33a and the second diaphragm 33b are provided with an opening 33c and a regulation portion 37, although this is not shown.

Figure 16A:
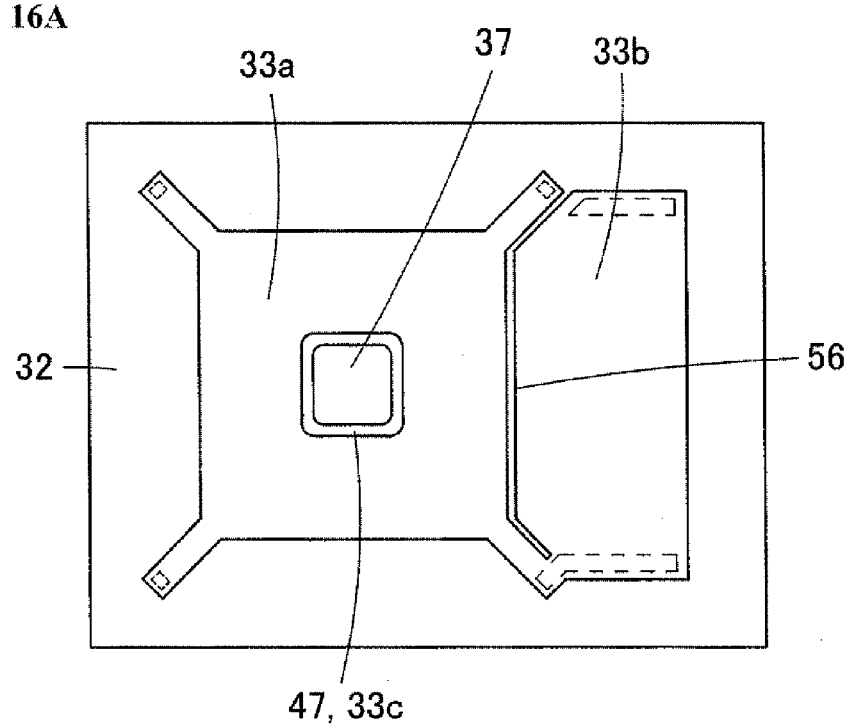
FIG. 16A is a plan view showing an acoustic sensor according to yet another variation of Embodiment 1 of the present invention, in a state in which the back plate has been removed.

Also, the opening 33c and the regulation portion 37 may be rectangular or polygonal as in yet another variation shown in FIG. 16A. Note that if the corner portions of the opening 33c and the regulation portion 37 are rounded in this case, it is possible to mitigate the concentration of stress and prevent damage to the diaphragm 33 and the regulation portion 37.

Figure 16B:
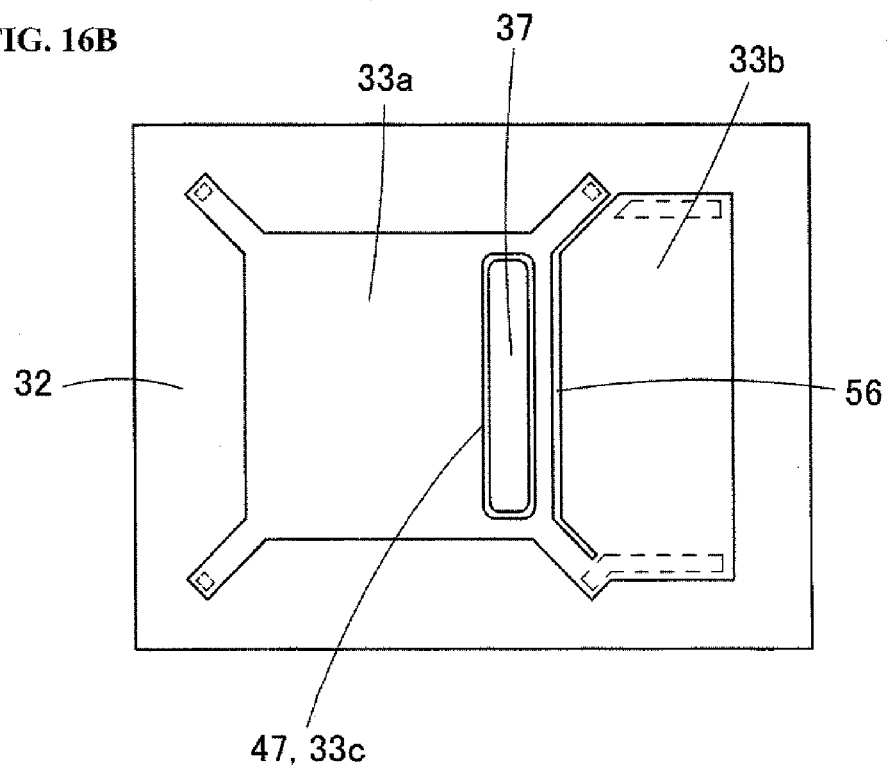
FIG. 16B is a plan view showing an acoustic sensor according to still another variation of Embodiment 1 of the present invention, in a state in which the back plate has been removed.

Furthermore, an opening 33c and a regulation portion 37 that are elongated in one direction and extend in a direction parallel to the slit-shaped opening 56 may be provided in the vicinity of the slit-shaped opening 56 as shown in FIG. 16B.

If the opening 33c is provided in the first diaphragm 33a or the second diaphragm 33b as shown in FIGS. 15A, 15B, 16A, and 16B, the area of the diaphragm 33 can be reduced, thus making it possible to contribute to a reduction in the size of the acoustic sensor 31.

Figure 17A:
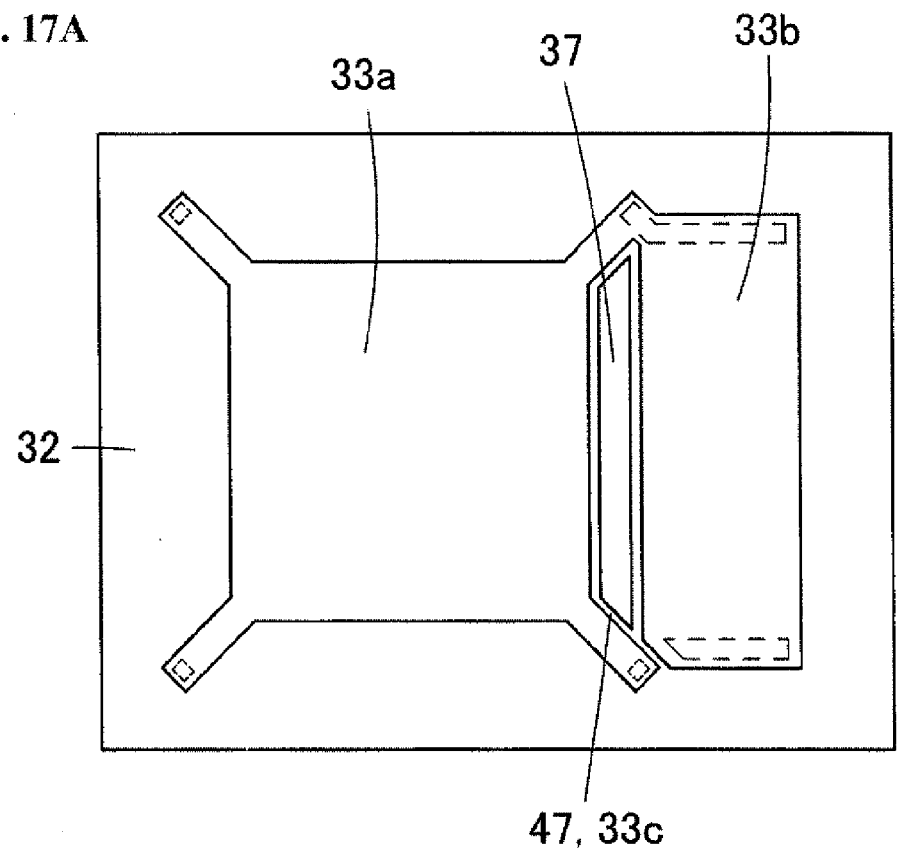
FIG. 17A is a plan view showing an acoustic sensor according to still another variation of Embodiment 1 of the present invention, in a state in which the back plate has been removed.
Figure 17B:
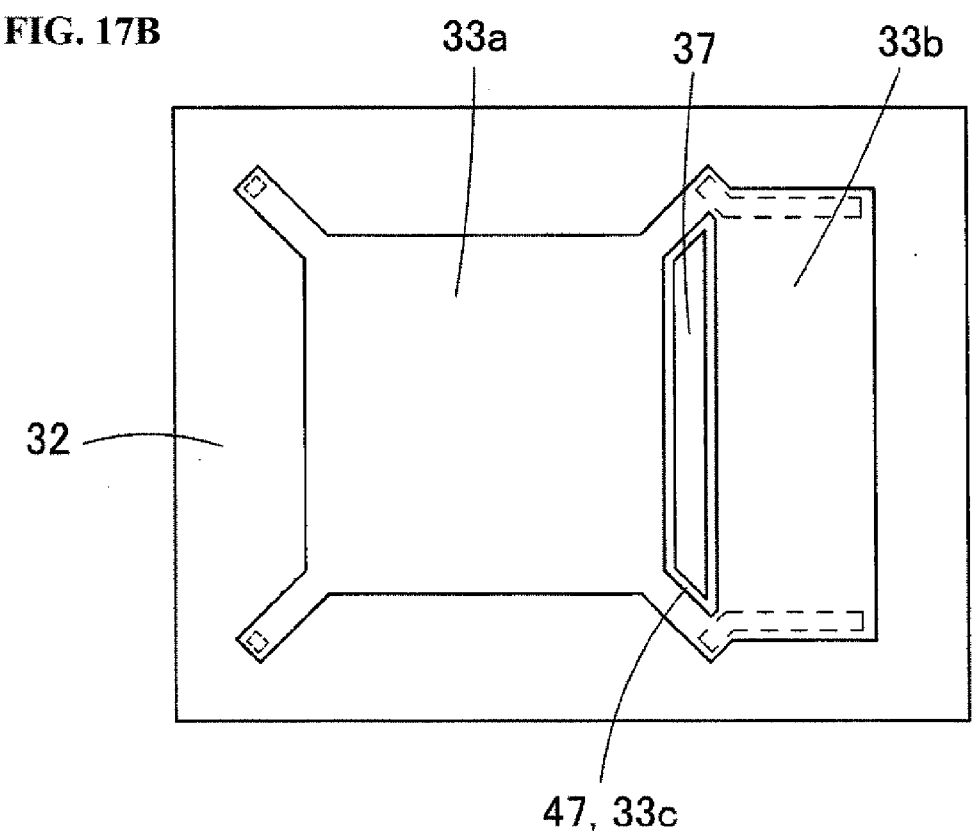
FIG. 17B is a plan view showing an acoustic sensor according to still another variation of Embodiment 1 of the present invention, in a state in which the back plate has been removed.

With the diaphragm 33 shown in FIG. 7, the first diaphragm 33a and the second diaphragm 33b are partially connected at the bottom of the figure, but the first diaphragm 33a and the second diaphragm 33b may be partially connected at the top of the figure as shown in FIG. 17A. Also, the first diaphragm 33a and the second diaphragm 33b may be partially connected at the top and the bottom of the figure as shown in FIG. 17B.

Figure 18:
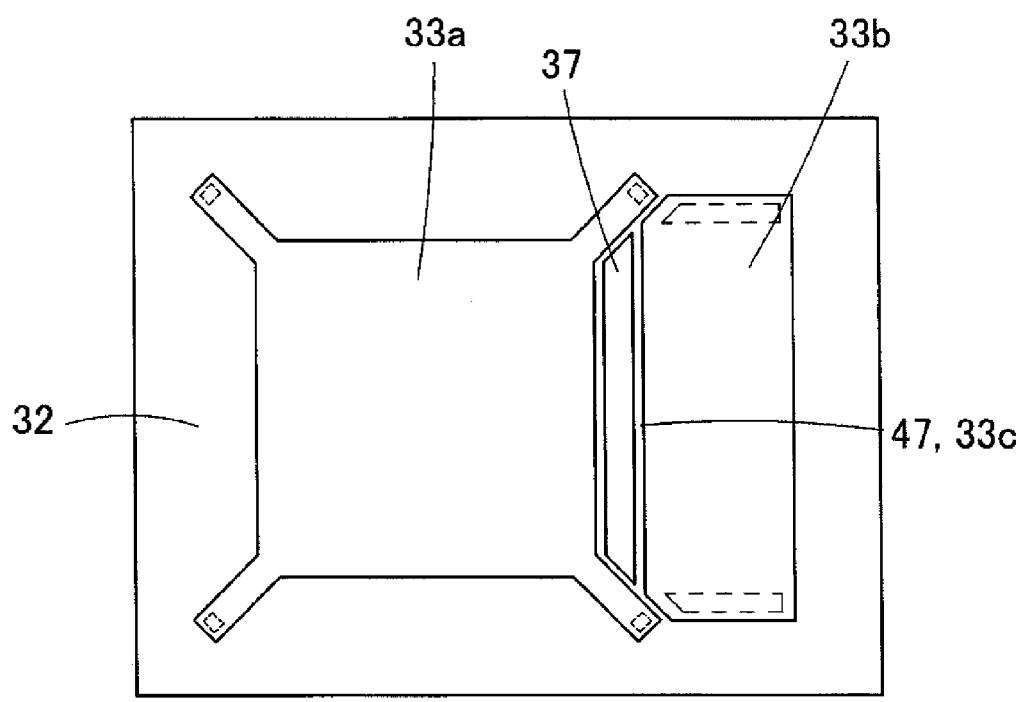
FIG. 18 is a plan view showing an acoustic sensor according to still another variation of Embodiment 1 of the present invention, in a state in which the back plate has been removed.

Also, the first diaphragm 33a and the second diaphragm 33b may be completely separated mechanically and electrically as shown in FIG. 18. In this case, there may be no issues if the first fixed electrode plate 39a and the second fixed electrode plate 39b are continuous with each other.

Embodiment 2

Figure 19A:
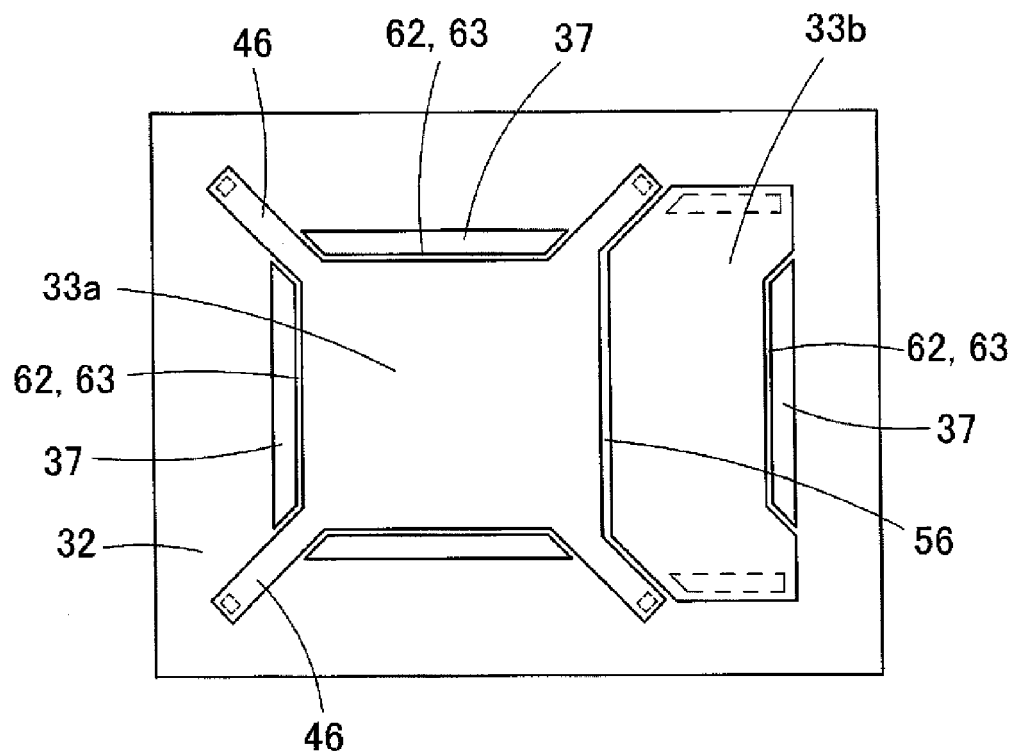
FIG. 19A is a plan view showing an acoustic sensor according to Embodiment 2 of the present invention, in a state in which the back plate has been removed.
Figure 19B:
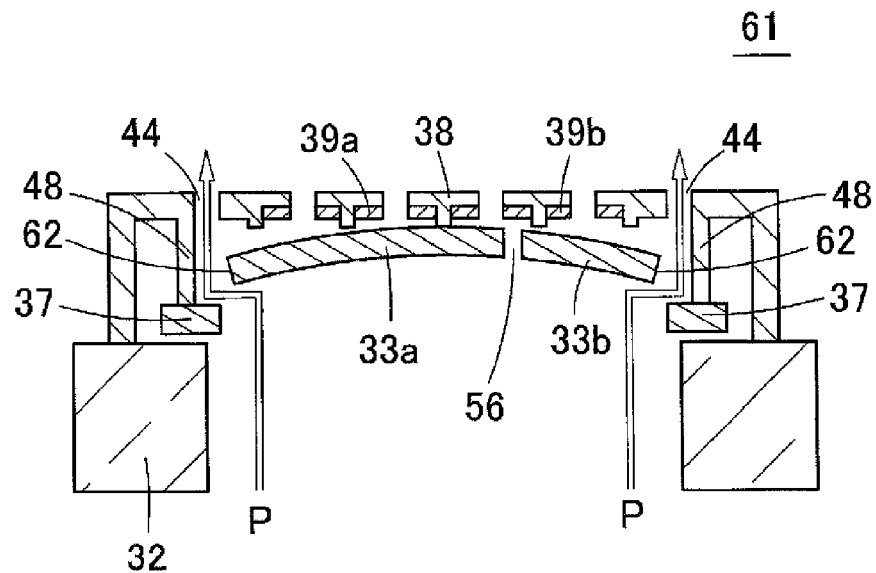
FIG. 19B is a schematic cross-sectional diagram showing a state in which high-load pressure is being applied to the acoustic sensor in FIG. 19A.

FIG. 19A is a plan view showing an acoustic sensor 61 according to Embodiment 2 of the present invention, in a state in which a back plate 38 has been removed. FIG. 19B is a schematic cross-sectional diagram showing a state in which high-load pressure P has been applied to the acoustic sensor 61. In the acoustic sensor 61 of Embodiment 2, recessions 62 that are recessed toward the interior of the diaphragm 33 in the shape of a notch (void portions for allowing pressure to escape) are formed in the sides (outer peripheral portions) of the diaphragm 33 as shown in FIG. 19A. Specifically, the recessions 62 are provided in regions between adjacent leg pieces 46 on the sides of the first diaphragm 33a that are not adjacent to the second diaphragm 33b. Alternatively, the recessions 62 may be provided on the long side of the second diaphragm 33b that is not adjacent to the first diaphragm 33a, or the recessions 62 may be provided on the sides of both the first diaphragm 33a and the second diaphragm 33b. According to one or more embodiments of the present invention, the recessions 62 reaches the vicinity of the cavity 35, and may reach the top of the cavity 35. Also, regulation portions 37 are positioned so as to fit into the recessions 62. The regulation portions 37 are positioned at the same height as the diaphragm 33, and are separated from the diaphragms 33a and 33b by slits 63. The other structures and variations are similar to Embodiment 1. According to one or more embodiments of the present invention, the width of the slits 63 is less than or equal to 10 μm, acoustic holes 44 are formed directly above the slits 63 in an overlapping manner, the acutely angled portion of the regulation portion 37 is rounded, and so on.

With the acoustic sensor 61 as well, when the diaphragm 33 is subjected to high-load pressure P from the cavity 35 side, the sides of the first diaphragm 33a and the second diaphragm 33b float upward as well as shown in FIG. 19B, and gaps for allowing pressure to escape are formed at the positions of the recessions 62. Accordingly, deformation of the first diaphragm 33a and the second diaphragm 33b can be reduced by allowing the high-load pressure P to escape, and damage to the diaphragms 33a and 33b and the back plate 38 can be avoided.

Also, in Embodiment 2, the recessions 62 are provided at locations away from the regions of the first diaphragm 33a and the second diaphragm 33b that primarily function as an electrode (i.e., the central portions), thus reducing the negative influence on the sensitivity of the acoustic sensor 61. Note that since the area of a single recession 62 cannot be made too large in Embodiment 2, it is desirable that multiple separate recessions 62 are provided.

Embodiment 3

Figure 20A:
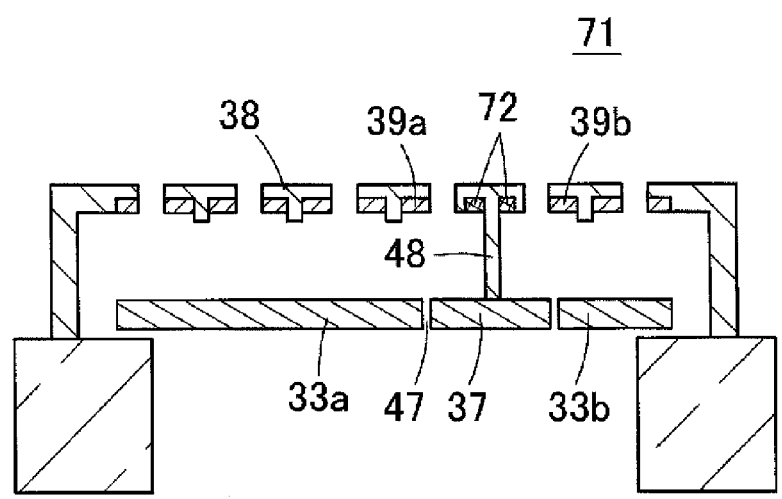
FIG. 20A is a schematic cross-sectional diagram of an acoustic sensor according to Embodiment 3 of the present invention.
Figure 20B:
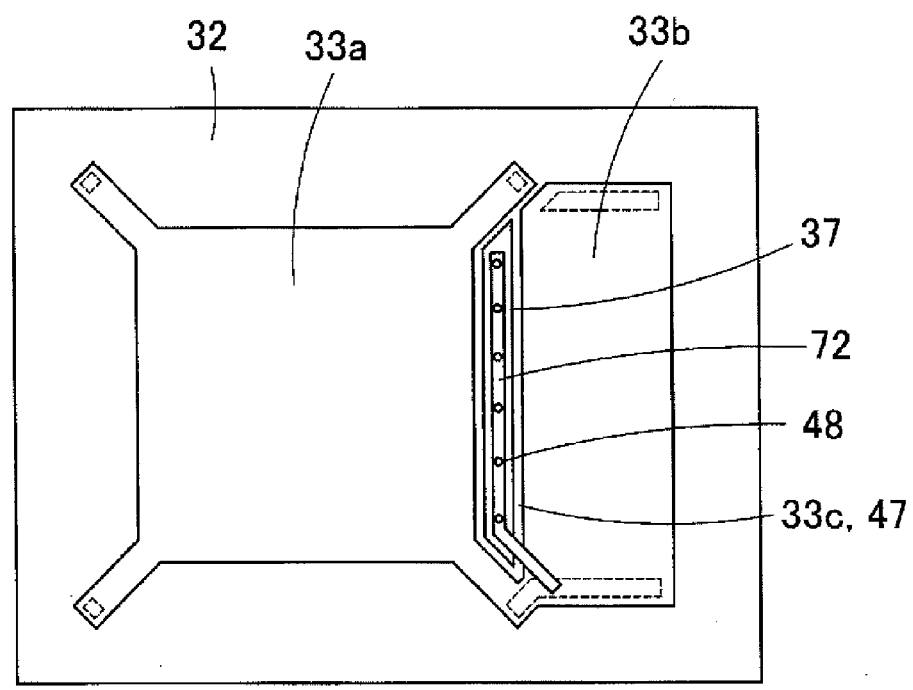
FIG. 20B is a plan view of the acoustic sensor in FIG. 20A in a state in which the back plate has been removed.

FIG. 20A is a schematic cross-sectional diagram of an acoustic sensor 71 according to Embodiment 3 of the present invention. FIG. 20B is a plan view of the acoustic sensor 71 in a state in which the back plate 38 has been removed. In the acoustic sensor 71 of Embodiment 3, a barrier electrode 72 is provided in a region of the lower surface of the back plate 38 that opposes the regulation portion 37. The barrier electrode 72 is formed by a conductive polysilicon thin film, and is created using the same material and the same process as the first fixed electrode plate 39a and the second fixed electrode plate 39b in the manufacturing process for the acoustic sensor 71. The barrier electrode 72 extends along the boundary between the first diaphragm 33a and the second diaphragm 33b, that is to say substantially from end to end along the length direction of the regulation portion 37. Note that the barrier electrode 72 may be grounded, or may be kept at a certain potential.

If the barrier electrode 72 is provided, it is possible to prevent noise and signals from being transmitting from the first fixed electrode plate 39a to the second fixed electrode plate 39b or from the second fixed electrode plate 39b to the first fixed electrode plate 39a, and it is possible to prevent a reduction in the S/N ratio of the first acoustic sensing portion 43a and the second acoustic sensing portion 43b and the occurrence of crosstalk. Also, by providing the barrier electrode 72 so as to be overlapped with the regulation portion 37 in a view from a direction perpendicular to the upper surface of the substrate 32, the barrier electrode 72 and the regulation portion 37 can be arranged logically, and the size of the acoustic sensor 71 can be reduced.

Figure 21A:
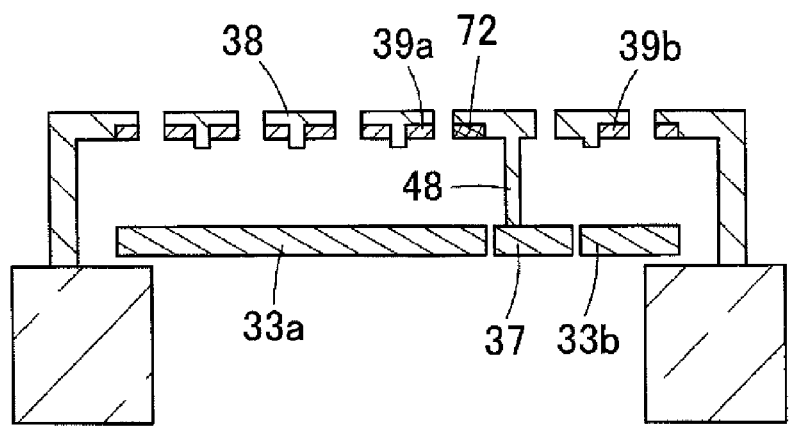
FIG. 21A is a schematic cross-sectional diagram of an acoustic sensor according to a variation of Embodiment 3 of the present invention.
Figure 21B:
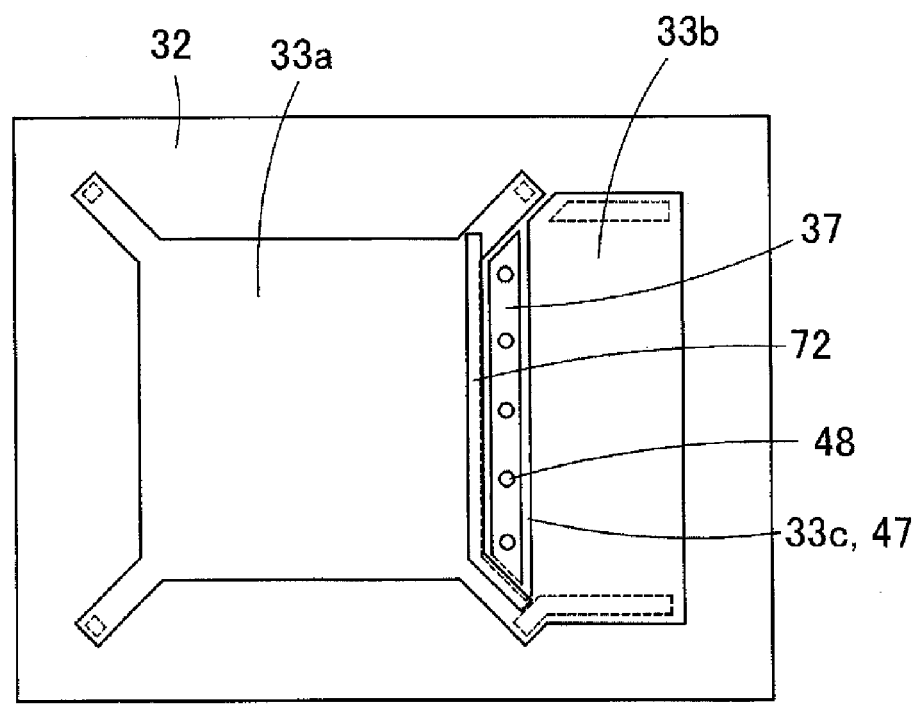
FIG. 21B is a plan view of the acoustic sensor in FIG. 21A in a state in which the back plate has been removed.

Also, the barrier electrode 72 may be provided parallel to the regulation portion 37 at a position separated from the regulation portion 37 as shown in FIGS. 21A and 21B.

Embodiment 4

Figure 22:
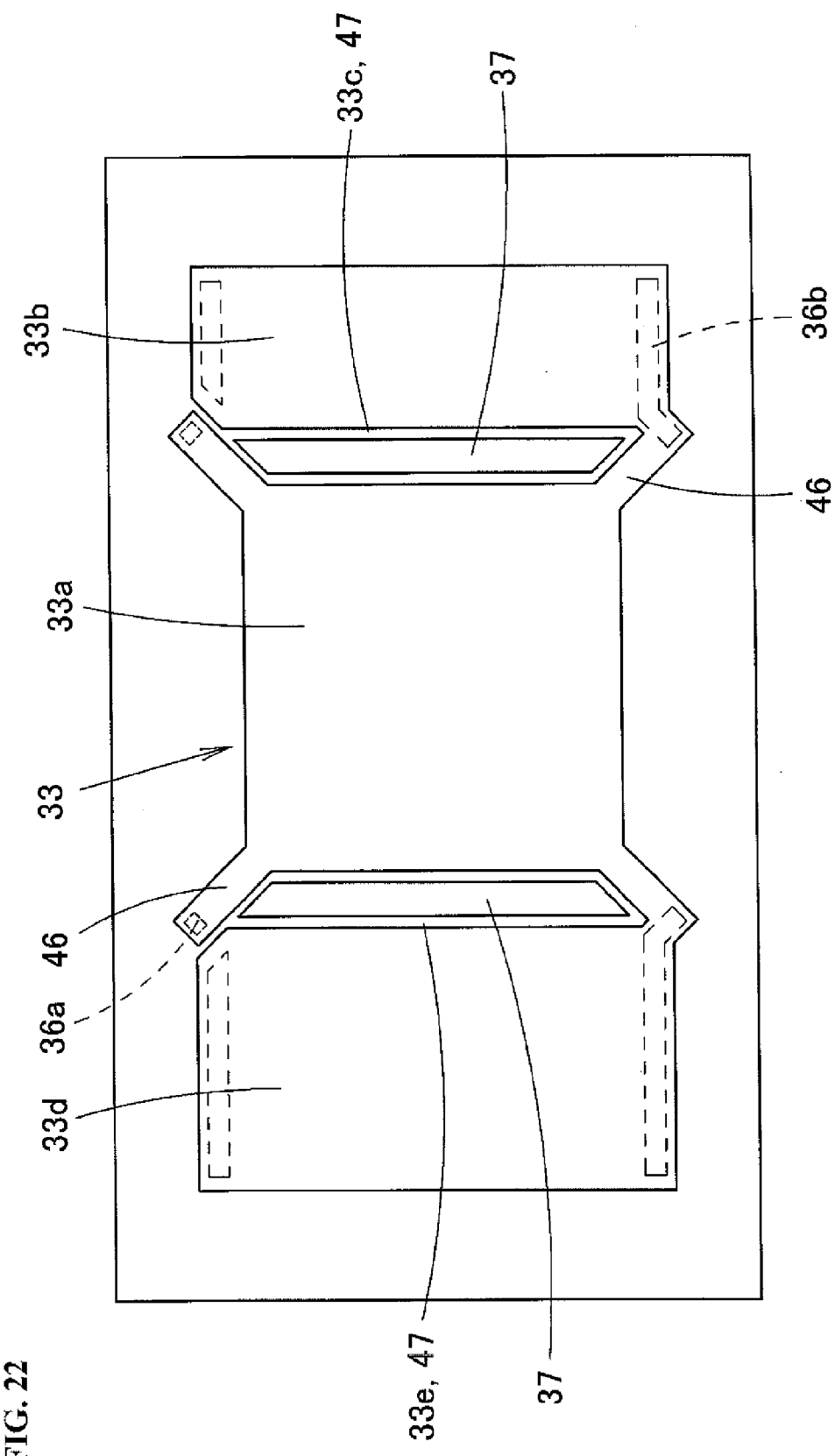
FIG. 22 is a plan view of an acoustic sensor according to Embodiment 4 of the present invention, in a state in which the back plate has been removed.

Although the diaphragm 33 is divided into two regions, namely the first diaphragm 33a and the second diaphragm 33b, in the acoustic sensors of one or more of the above embodiments, the diaphragm 33 may be divided into three or more regions. FIG. 22 is a plan view of an acoustic sensor according to Embodiment 4 of the present invention, in a state in which the back plate has been removed, and the diaphragm 33 has been divided into three regions. The fixed electrode plate 39 is also divided into three regions in correspondence with the diaphragm 33, and thus the acoustic sensor has three acoustic sensing portions.

The diaphragm 33 shown in FIG. 22 is divided into a first diaphragm 33a having the largest area, a second diaphragm 33b having the smallest area, and a third diaphragm 33d having an intermediate area. The first diaphragm 33a and the second diaphragm 33b are divided by the opening 33c, and the first diaphragm 33a and the third diaphragm 33d are divided by an opening 33e (a void portion for allowing pressure to escape). A regulation portion 37 is accommodated in the openings 33c and 33e, and a slit 47 is formed around each of the regulation portions 37. Although not shown, the regulation portions 37 are each supported horizontally on the lower end of a support portion 48 extending downward from the back plate 38, similarly to the case in Embodiment 1.

The first diaphragm 33a having the largest area is paired with the corresponding fixed electrode plate so as to configure a high-sensitivity sensing portion for low volume. The second diaphragm 33b having the smallest area is paired with the corresponding fixed electrode plate so as to configure a low-sensitivity sensing portion for high volume. The third diaphragm 33d having an intermediate area is paired with the corresponding fixed electrode plate so as to configure an intermediate-sensitivity sensing portion for intermediate volume. Accordingly, Embodiment 4 enables providing an acoustic sensor with a wide dynamic range.

With this acoustic sensor as well, if the diaphragms 33a, 33b, and 33d undergo deformation due to the acoustic sensor being dropped for example, the openings 33c and 33e open and high-load pressure escapes such that deformation of the diaphragms 33a, 33b, and 33d is suppressed, and damage to the diaphragms 33a, 33b, and 33d and the back plate 38 is prevented.

Embodiment 5

Figure 23:
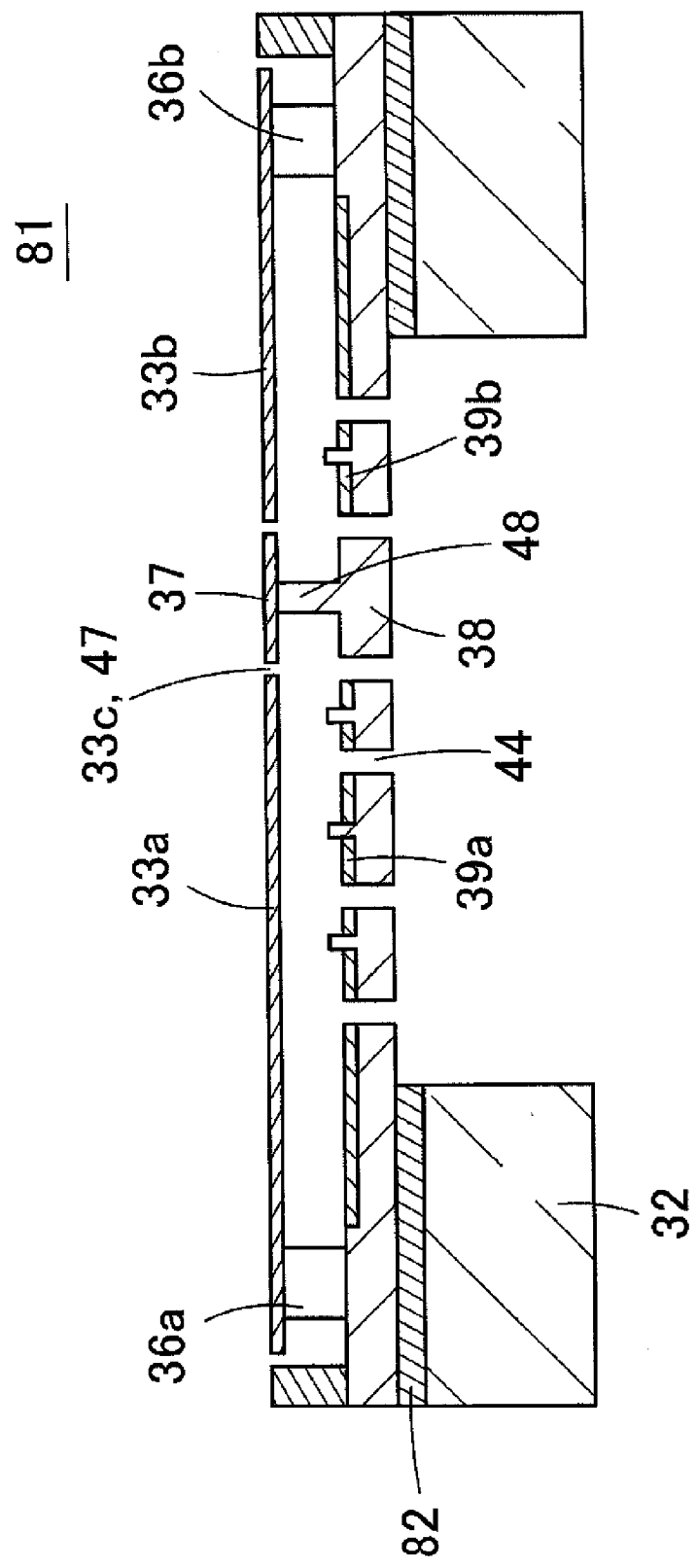
FIG. 23 is a cross-sectional diagram of an acoustic sensor according to Embodiment 5 of the present invention.

FIG. 23 is a cross-sectional diagram of an acoustic sensor 81 according to Embodiment 5 of the present invention, a feature of which is that diaphragms 33a and 33b are provided above the fixed electrode plates 39a and 39b. In the acoustic sensor 81, a flat plate-shaped back plate 38 is provided on the upper surface of the substrate 32 via an insulation layer 82. The fixed electrode plates 39a and 39b are formed on the upper surface of the back plate 38. Multiple acoustic holes 44 are formed in the back plate 38 and the fixed electrode plates 39a and 39b above the cavity 35. Also, the diaphragms 33a and 33b are arranged so as to oppose the fixed electrode plates 39a and 39b above the back plate 38. The diaphragms 33a and 33b are supported by anchors 36a and 36b provided on the upper surface of the back plate 38.

The diaphragm has the same structure as the diaphragm 33 used in the acoustic sensor 31 of Embodiment 1 for example. Specifically, the diaphragm is divided into the first diaphragm 33a and the second diaphragm 33b, and the opening 33c is provided between the first diaphragm 33a and the second diaphragm 33b. The regulation portion 37 is accommodated in the opening 33c, and the regulation portion 37 is fixed to the upper end of the support portion 48 standing on the upper surface on the back plate 38.

Embodiment 6

In one or more of the above embodiments, the opening 33c provided in the diaphragm 33 is substantially blocked by the regulation portion 37 in the normal operating state, but a configuration is possible in which the opening 33c, which is the void portion for allowing pressure to escape, is covered by the upper surface of the substrate 32 so as to hinder the leakage of air pressure in the opening 33c.

Figure 24A:
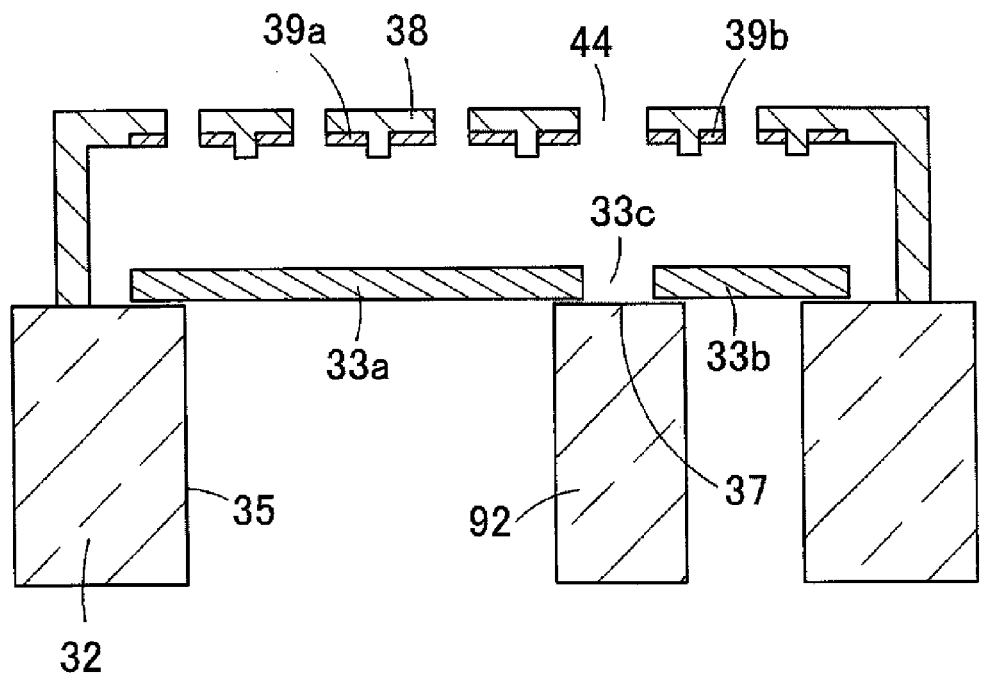
FIG. 24A is a schematic cross-sectional diagram of an acoustic sensor according to Embodiment 6 of the present invention.
Figure 24B:
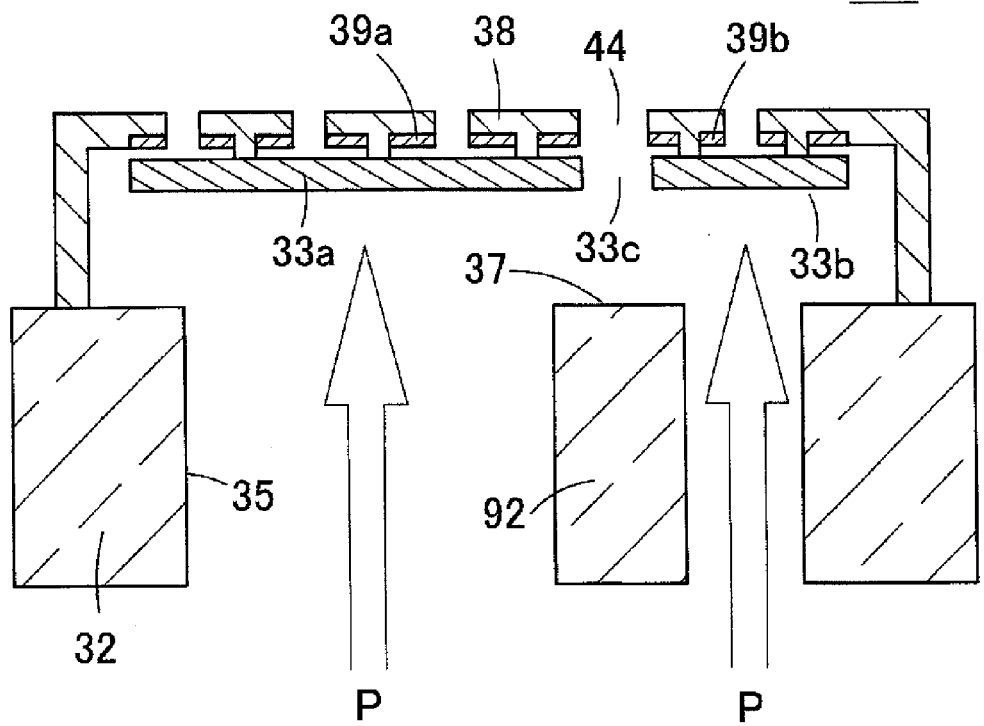
FIG. 24B is a schematic cross-sectional diagram showing a state in which a large degree of pressure is being applied to the two diaphragms from below in the acoustic sensor in FIG. 24A.
Figure 25A:
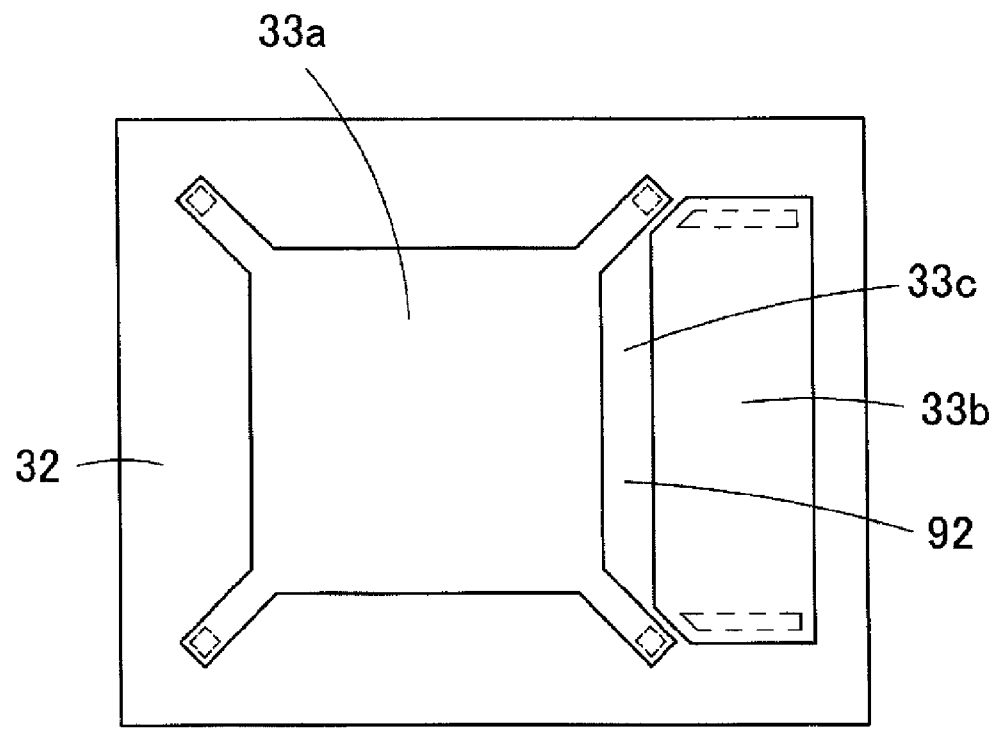
FIG. 25A is a plan view of the acoustic sensor in FIG. 24A in a state in which the back plate has been removed.
Figure 25B:
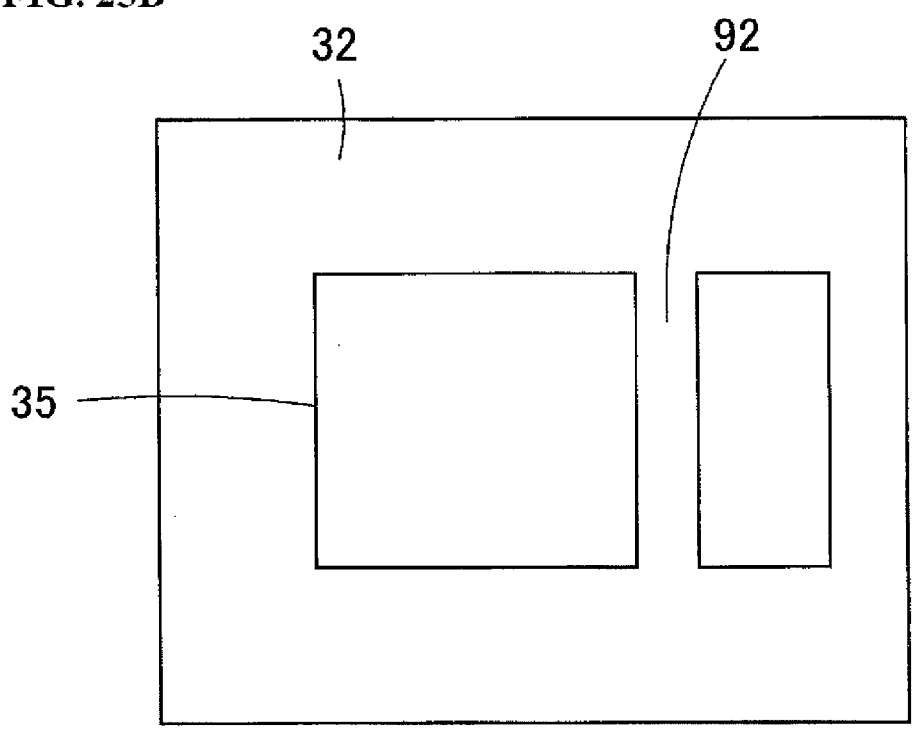
FIG. 25B is a plan view of a substrate used in the acoustic sensor in FIG. 24A.

FIG. 24A is a schematic cross-sectional diagram of an acoustic sensor 91 according to Embodiment 6 of the present invention. FIG. 24B is a schematic cross-sectional diagram of the acoustic sensor 91 in a state in which a large degree of high-load pressure is being applied to the two diaphragms from below. Also, FIG. 25A is a plan view of the acoustic sensor 91 in a state in which the back plate has been removed. FIG. 25B is a plan view of the substrate 32 used in the acoustic sensor 91.

As shown in FIG. 25A, in the acoustic sensor 91, the diaphragm 33 is divided into the first diaphragm 33a and the second diaphragm 33b, and the opening 33c is formed between the two diaphragms 33a and 33b. On the other hand, as shown in FIG. 25B, a protrusion portion 92 that is shaped as a partition wall or a beam and extends parallel to the length direction of the opening 33c is provided in the cavity 35 of the substrate 32, and the underside of the opening 33c is blocked by the upper surface of the substrate 32, or more specifically the upper surface of the protrusion portion 92. Accordingly, a portion of the upper surface of the substrate 32, that is to say the upper surface of the protrusion portion 92, serves as the regulation portion 37.

When normal acoustic vibration is being detected in the acoustic sensor 91, the leakage of air pressure in the opening 33c is hindered by the upper surface of the substrate 32 (protrusion portion 92) as shown in FIG. 24A, and therefore the acoustic resistance of the acoustic sensor 91 is not likely to decrease, and it is possible to maintain the characteristics of the acoustic sensor 91 in the low frequency range. In contrast, when the diaphragm 33 is subjected to high-load pressure P from below, the diaphragms 33a and 33b float upward as shown in FIG. 24B so as to open the opening 33c and allow the pressure P to escape through the opening 33c.

Embodiment 7

Figure 26A:
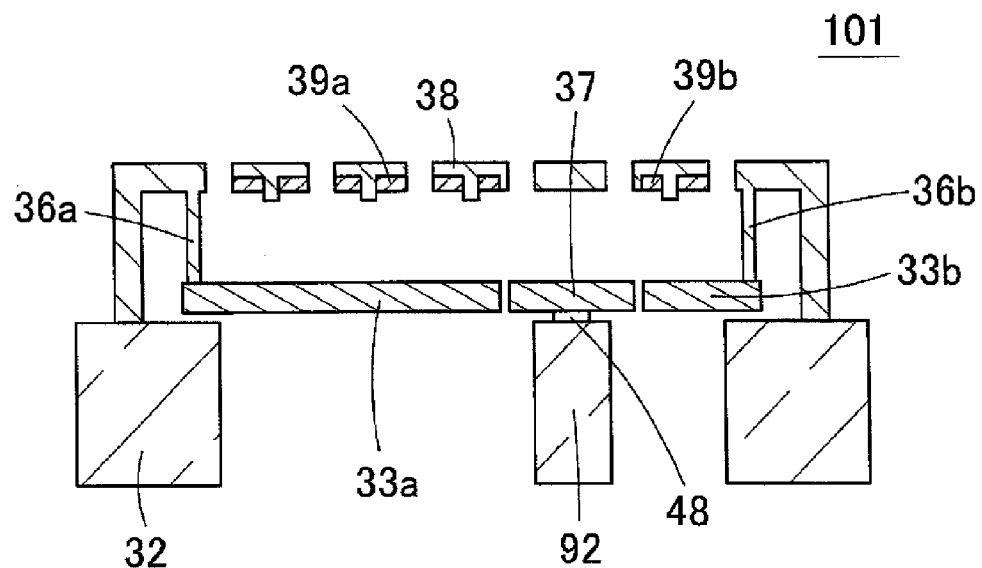
FIG. 26A is a schematic cross-sectional diagram of an acoustic sensor according to Embodiment 7 of the present invention.
Figure 26B:
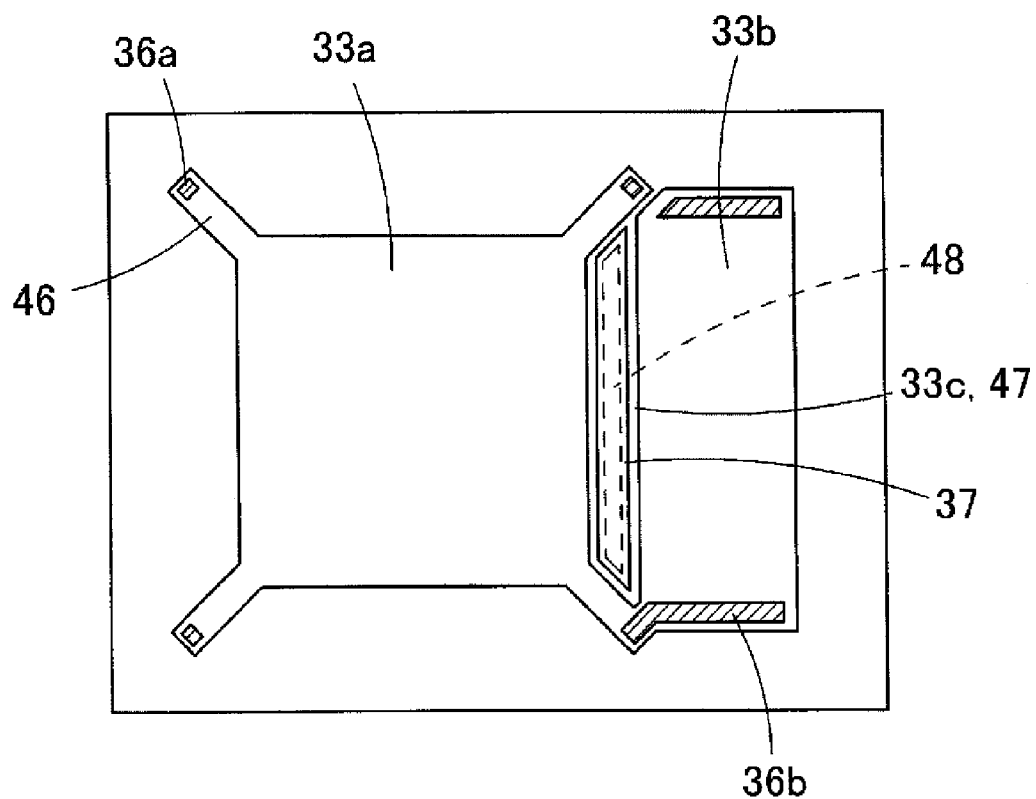
FIG. 26B is a plan view of the acoustic sensor in FIG. 26A in a state in which the back plate has been removed.

FIG. 26A is a schematic cross-sectional diagram of an acoustic sensor 101 according to a variation of Embodiment 7 of the present invention. Also, FIG. 26B is a plan view of the acoustic sensor 101 in a state in which the back plate has been removed. In the acoustic sensor 101, the regulation portion 37 located in the opening 33c is fixed to the upper surface of the substrate 32, that is to say the upper surface of the support portion 48 provided on the upper surface of the protrusion portion 92. Also, the leg pieces 46 of the diaphragm 33 and the two end portions of the second diaphragm 33b are fixed to the lower ends of the anchors 36a and 36b extending downward from the lower surface of the back plate 38.

Embodiment 8

Figure 27:
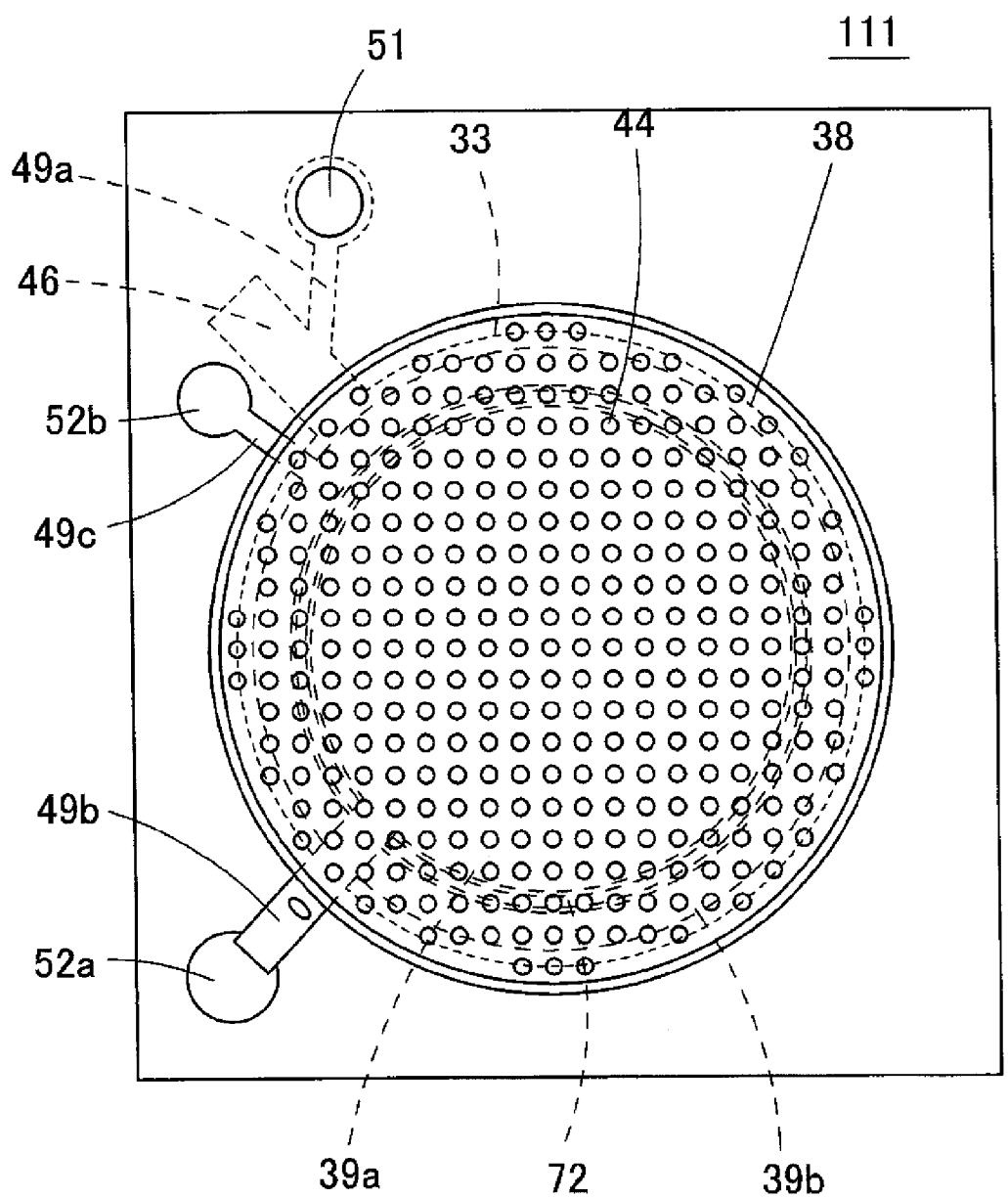
FIG. 27 is a plan view showing an acoustic sensor according to Embodiment 8 of the present invention.
Figure 28:
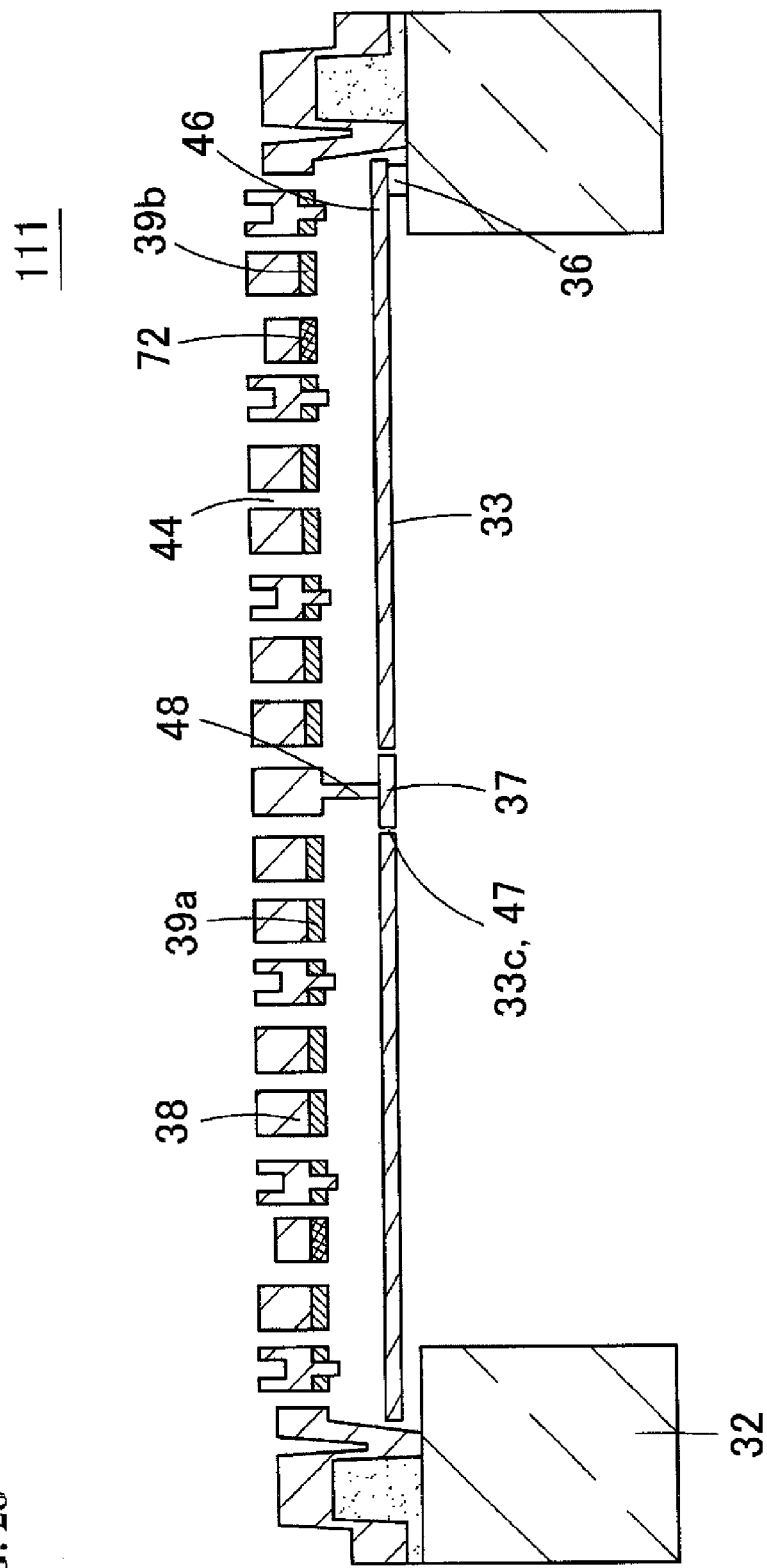
FIG. 28 is a cross-sectional diagram of the acoustic sensor in FIG. 27.
Figure 29A:
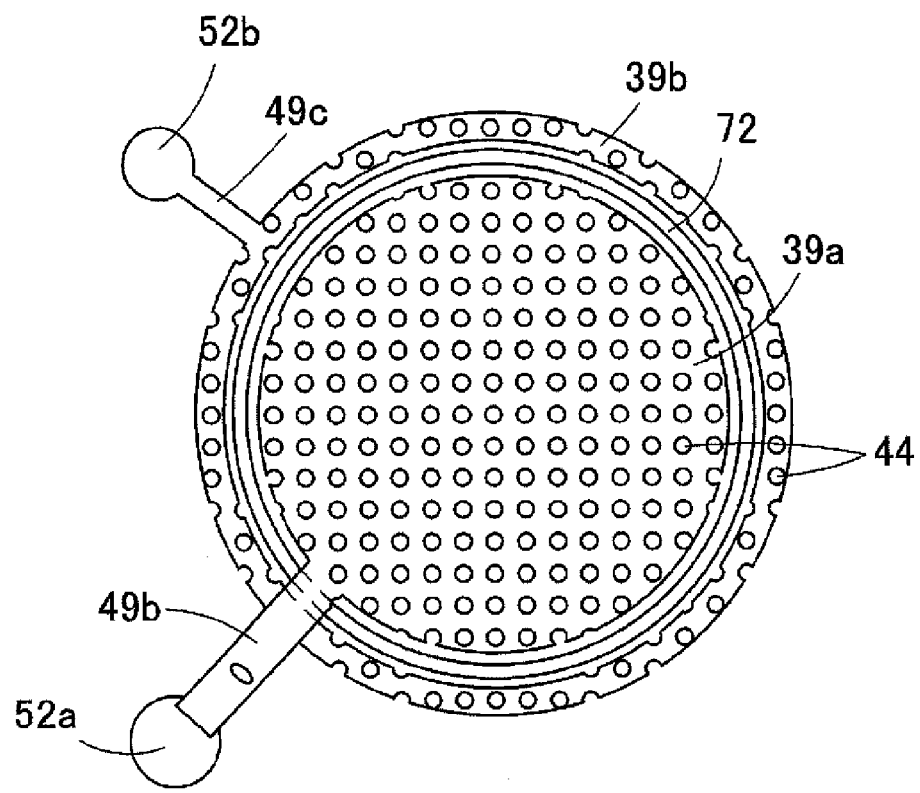
FIG. 29A is a plan view of fixed electrode plates and a barrier electrode provided on the lower surface of a back plate in the acoustic sensor in FIG. 27.
Figure 29B:
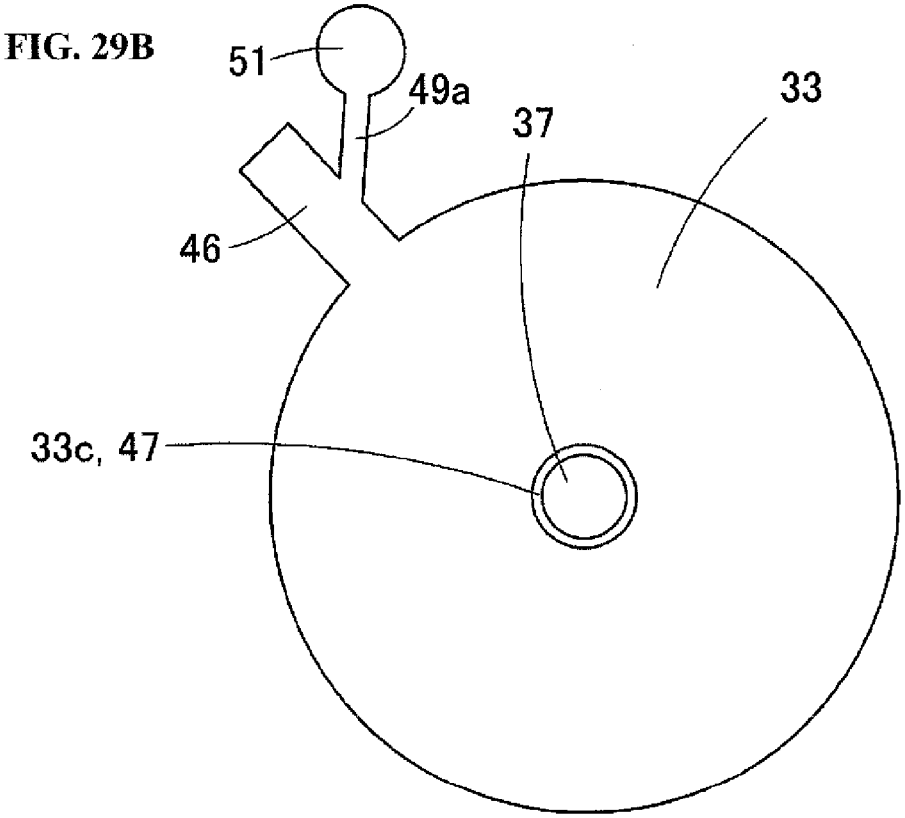
FIG. 29B is a plan view of a diaphragm used in the acoustic sensor in FIG. 27.

The electrode portions are not limited to being rectangular, and may be circular. FIG. 27 is a plan view showing an acoustic sensor 111 according to Embodiment 8 of the present invention. FIG. 28 is a cross-sectional diagram of the acoustic sensor 111. FIG. 29A is a plan view showing a barrier electrode 72 and fixed electrode plates 39a and 39b provided on the lower surface of the back plate 38 in the acoustic sensor 111. FIG. 29B is a plan view of the diaphragm 33 used in the acoustic sensor 111.

As shown in FIG. 28, in the acoustic sensor 111, a circular diaphragm 33 is provided on the upper surface of the substrate 32. One leg piece 46 extends from the outer peripheral portion of the circular diaphragm 33, and the diaphragm 33 is supported in a cantilever manner by the leg piece 46, which is supported by an anchor 36. As shown in FIG. 29B, the opening 33c is formed in the central portion of the diaphragm 33. Also, as shown in FIGS. 27 and 29B, a lead-out interconnect 49a extends from the leg piece 46, and the lead-out interconnect 49a is connected to a common electrode pad 51. The regulation portion 37 is arranged in the opening 33c of the diaphragm 33, and the opening 33c is blocked by the regulation portion 37. Note that the slit 47 is formed between the diaphragm 33 and the regulation portion 37 so as to prevent them from coming into contact and causing interference. The regulation portion 37 is supported horizontally by a support portion 48 that extends downward from the back plate 38 for example.

On the other hand, as shown in FIGS. 28 and 29A, a disk-shaped first fixed electrode plate 39a is provided in the central portion of the lower surface of the back plate 38. A circular ring-shaped barrier electrode 72 is provided outside of the first fixed electrode plate 39a so as to not come into contact with the first fixed electrode plate 39a. A circular disk-shaped second fixed electrode plate 39b is provided outside of the barrier electrode 72 so as to not come into contact with the barrier electrode 72. As shown in FIGS. 27 and 29A, a lead-out interconnect 49b extends from the outer peripheral portion of the first fixed electrode plate 39a, and the lead-out interconnect 49b is connected to a first electrode pad 52a. A lead-out interconnect 49c extends from the second fixed electrode plate 39b, and the lead-out interconnect 49c is connected to a second electrode pad 52b.

In the acoustic sensor 111, a circular low-volume high-sensitivity acoustic sensing portion is configured by the central portion of the diaphragm 33 and the first fixed electrode plate 39a. Also, a circular ring-shaped high-volume low-sensitivity acoustic sensing portion is configured by the outer peripheral portion of the diaphragm 33 and the second fixed electrode plate 39b.

Also, in the acoustic sensor 111 as well, when the diaphragm 33 is subjected to high-load pressure, the diaphragm 33 undergoes large deformation so as to open the opening 33c and allow the high-load pressure to escape through the opening 33c.

Embodiment 9

Figure 30:
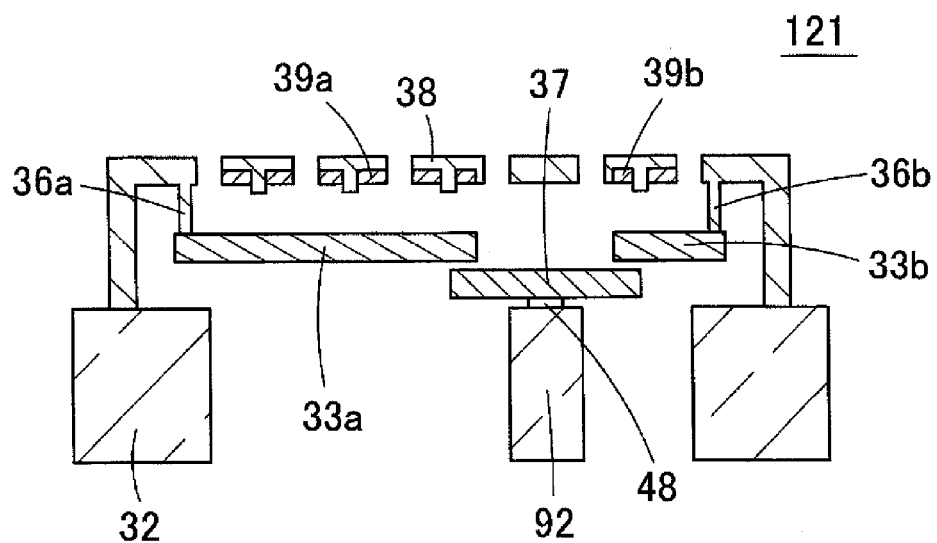
FIG. 30 is a schematic cross-sectional diagram of an acoustic sensor according to Embodiment 9 of the present invention.

FIG. 30 is a schematic cross-sectional diagram showing the structure of an acoustic sensor 121 according to Embodiment 9 of the present invention. In the acoustic sensor 91 of Embodiment 6 (FIG. 24), the leakage of air pressure is hindered by arranging the upper surface of the substrate 32 in opposition to the lower opening of the void portion (opening 33c), but a leak pressure regulation portion 37 that is separate from the substrate may be used. Specifically, a plate-shaped or thin film-shaped leak pressure regulation portion 37 may be arranged in opposition to the upper side or the lower side of the diaphragm 33 so as to substantially block either the upper opening or the lower opening of the void portion of the diaphragm 33 when it is not undergoing deformation. In the example shown in FIG. 30, the leak pressure regulation portion 37 is fixed by a support portion 48 provided on the upper surface of the substrate 32, and the opening 33c between the first diaphragm 33a and the second diaphragm 33b is blocked from the lower side by the leak pressure regulation portion 37.

Application in Microphone

Figure 31:
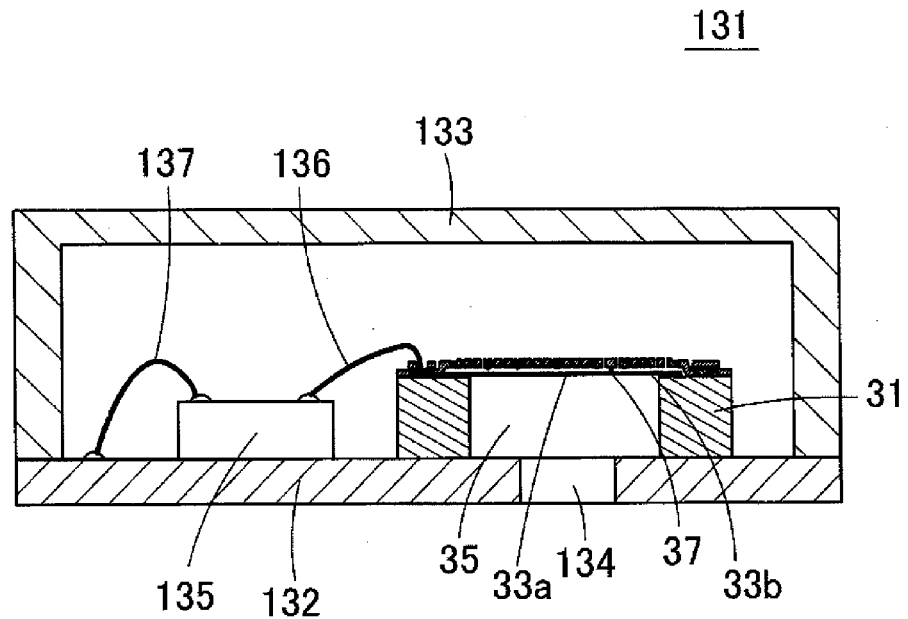

FIG. 31 is a schematic cross-sectional diagram of a bottom port type of microphone 131 including an acoustic sensor according to one or more embodiments of the present invention, such as the acoustic sensor 31 of Embodiment 1. This microphone 131 has the acoustic sensor 31 and a signal processing circuit 135 (ASIC), which is a circuit portion, built into a package made up of a circuit substrate 132 and a cover 133. The acoustic sensor 31 and the signal processing circuit 135 are mounted on the upper surface of the circuit substrate 132. A sound introduction hole 134 for the introduction of acoustic vibration into the acoustic sensor 31 is formed in the circuit substrate 132. The acoustic sensor 31 is mounted on the upper surface of the circuit substrate 132 such that the lower opening of the cavity 35 is aligned with the sound introduction hole 134 and covers the sound introduction hole 134. Accordingly, the cavity 35 of the acoustic sensor 31 is the front chamber, and the space inside the package is the back chamber.

The acoustic sensor 31 and the signal processing circuit 135 are connected by a bonding wire 136. Furthermore, the signal processing circuit 135 is connected to the circuit substrate 132 by a bonding wire 137. Note that signal processing circuit 135 has a function of supplying power to the acoustic sensor 31 and a function of outputting a capacitance change signal from the acoustic sensor 31 to the outside.

A cover 133 is attached to the upper surface of the circuit substrate 132 so as to cover the acoustic sensor 31 and the signal processing circuit 135. The package has an electromagnetic shielding function, and protects the acoustic sensor 31 and the signal processing circuit 135 from mechanical shock and electrical disturbances from the outside.

In this way, acoustic vibration that has entered the cavity 35 through the sound introduction hole 134 is detected by the acoustic sensor 31, and then output after being subjected to amplification and signal processing by the signal processing circuit 135. Since the space inside the package is the back chamber in this microphone 131, the area of the back chamber can be increased, and the sensitivity of the microphone 131 can be increased.

Note that in this microphone 131, the sound introduction hole 134 for introducing acoustic vibration into the package may be formed in the upper surface of the cover 133. In this case, the cavity 35 of the acoustic sensor 31 is the back chamber, and the space inside the package is the front chamber.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. An acoustic transducer comprising:
a substrate having a cavity;
a vibrating electrode plate disposed above the substrate and having a void portion that allows pressure to escape;
a fixed electrode plate disposed above the substrate opposite the vibrating electrode plate;
a plurality of sensing portions configured by the vibrating electrode plate and the fixed electrode plate, at least one of the vibrating electrode plate and the fixed electrode plate being divided into a plurality of regions, and a sensing portion being configured by the vibrating electrode plate and the fixed electrode plate in each of the divided regions; and
a leak pressure regulation portion that hinders leakage of air pressure passing through the void portion when the vibrating electrode plate is net undergoing deformation, and becomes separated from the void portion and allow pressure to escape by passing through the void portion when the vibrating electrode plate undergoes deformation from being subjected to pressure,
wherein the void portion is a recession that is formed in an edge of the vibrating electrode plate and is recessed toward the interior of the vibrating electrode plate, and
wherein the leak pressure regulation portion is a plate-shaped member that is located in the recession in the vibrating electrode plate when the vibrating electrode plate is not undergoing deformation.

2. The acoustic transducer according to claim 1, wherein the plurality of sensing portions output signals with different sensitivities.

3. The acoustic transducer according to claim 1, wherein the void portion is a gap between divided regions of the vibrating electrode plate.

4. The acoustic transducer according to claim 3, wherein the vibrating electrode plate is divided into a plurality of regions by the gap.

5. The acoustic transducer according to claim 3, wherein the leak pressure regulation portion is a plate-shaped member that is accommodated in the gap in the vibrating electrode plate when the vibrating electrode plate is not undergoing deformation.

6. The acoustic transducer according to claim 1, wherein the void portion is an opening formed in the vibrating electrode plate.

7. The acoustic transducer according to claim 6, wherein the leak pressure regulation portion is a plate-shaped member that is accommodated in the opening in the vibrating electrode plate when the vibrating electrode plate is not undergoing deformation.

8. The acoustic transducer according to claim 1,
wherein the leak pressure regulation portion is located in the void portion in the vibrating electrode plate when the vibrating electrode plate is not undergoing deformation, and
wherein a slit is formed between an edge of the leak pressure regulation portion and an edge of the void portion.

9. The acoustic transducer according to claim 8, wherein the width of the slit is less than or equal to 10 μm.

10. The acoustic transducer according to claim 4, wherein an end of a slit formed between the leak pressure regulation portion and a divided region of the vibrating electrode plate located on one side across the gap and an end of a slit formed between the leak pressure regulation portion and a divided region of the vibrating electrode plate located on another side across the gap intersect with an angle of 90°.

11. The acoustic transducer according to claim 1, wherein the leak pressure regulation portion is a portion of an upper surface of the substrate that is located so as to block the lower opening of the void portion in the vibrating electrode plate when the vibrating electrode plate is not undergoing deformation.

12. The acoustic transducer according to claim 1, wherein the leak pressure regulation portion is disposed opposite an upper side or a lower side of the vibrating electrode plate to block one of an upper opening and a lower opening of the void portion in the vibrating electrode plate when the vibrating electrode plate is not undergoing deformation.

13. The acoustic transducer according to claim 1,
wherein a back plate is disposed above the substrate opposite the vibrating electrode plate,
wherein a support portion is disposed on a surface of the back plate that opposes the vibrating electrode plate, and
wherein the leak pressure regulation portion is fixed to the support portion.

14. The acoustic transducer according to claim 13, wherein the horizontal cross-sectional area of the support portion is smaller than the area of the leak pressure regulation portion.

15. The acoustic transducer according to claim 13, wherein the leak pressure regulation portion is supported by a plurality of support portions.

16. The acoustic transducer according to claim 15, wherein a through-hole is formed in the back plate between adjacent support portions.

17. The acoustic transducer according to claim 5, wherein the leak pressure regulation portion is fixed to a support portion disposed on an upper surface of the substrate.

18. The acoustic transducer according to claim 1,
wherein a back plate is disposed above the substrate opposite the vibrating electrode plate,
wherein the fixed electrode plate is disposed on the back plate opposite the vibrating electrode plate,
wherein a plurality of acoustic holes are formed in the back plate and the fixed electrode plate, and
wherein a portion of the acoustic holes are overlapped with the void portion in a view from a direction perpendicular to the upper surface of the substrate.

19. The acoustic transducer according to claim 8,
wherein a back plate is disposed above the substrate opposite the vibrating electrode plate,
wherein the fixed electrode plate is disposed on the back plate opposite the vibrating electrode plate,
wherein a plurality of acoustic holes are formed in the back plate and the fixed electrode plate, and
wherein a portion of the acoustic holes are overlapped with the slit in a view from a direction perpendicular to the upper surface of the substrate.

20. The acoustic transducer according to claim 1,
wherein a back plate is disposed above the substrate opposite the vibrating electrode plate,
wherein the fixed electrode plate is disposed on the back plate opposite the vibrating electrode plate,
wherein a plurality of acoustic holes are formed in the back plate and the fixed electrode plate, and
wherein the width of the leak pressure regulation portion is greater than the distance between adjacent acoustic holes in a view from a direction perpendicular to the upper surface of the substrate.

21. The acoustic transducer according to claim 1,
wherein a back plate is disposed above the substrate opposite the vibrating electrode plate, and
wherein the fixed electrode plate is disposed on the back plate opposite the vibrating electrode plate, and not opposite the leak pressure regulation portion.

22. The acoustic transducer according to claim 1,
wherein the fixed electrode plate is divided into a plurality of regions, and
wherein a barrier electrode for blocking electrical signal leakage is disposed between divided regions of the fixed electrode plate.

23. The acoustic transducer according to claim 1,
wherein a back plate is disposed above the substrate opposite the vibrating electrode plate, and
a protrusion is disposed on the back plate so as to oppose a region of the vibrating electrode plate that is adjacent to the void portion.

24. The acoustic transducer according to claim 5, wherein the divided regions of the vibrating electrode plate and the leak pressure regulation portion are in the same plane and are formed using the same material.

25. The acoustic transducer according to claim 1, wherein the leak pressure regulation portion and the vibrating electrode plate having the void portion are formed by forming a thin film over the substrate and dividing the thin film with a slit in a manufacturing process.

26. A microphone comprising:
the acoustic transducer according to claim 1; and
a circuit portion that amplifies a signal from the acoustic transducer and outputs the amplified signal to the outside.

* * * * *